United States Patent
Carroll et al.

(10) Patent No.: US 10,840,426 B2
(45) Date of Patent: Nov. 17, 2020

(54) THERMOELECTRIC APPARATUS AND ARTICLES AND APPLICATIONS THEREOF

(71) Applicant: Wake Forest University, Winston-Salem, NC (US)

(72) Inventors: David L. Carroll, Winston-Salem, NC (US); Robert Summers, Clemmons, NC (US)

(73) Assignee: WAKE FOREST UNIVERSITY, Winston-Salem, NC (US)

( * ) Notice: Subject to any disclaimer, the term of this patent is extended or adjusted under 35 U.S.C. 154(b) by 0 days.

(21) Appl. No.: 14/776,150

(22) PCT Filed: Mar. 14, 2014

(86) PCT No.: PCT/US2014/027486
§ 371 (c)(1),
(2) Date: Sep. 14, 2015

(87) PCT Pub. No.: WO2014/152570
PCT Pub. Date: Sep. 25, 2014

(65) Prior Publication Data
US 2016/0035956 A1    Feb. 4, 2016

Related U.S. Application Data

(60) Provisional application No. 61/783,709, filed on Mar. 14, 2013, provisional application No. 61/808,472, filed on Apr. 4, 2013.

(51) Int. Cl.
*H01L 35/30* (2006.01)
*H01L 35/32* (2006.01)
(Continued)

(52) U.S. Cl.
CPC .............. *H01L 35/32* (2013.01); *H01L 35/22* (2013.01); *H01L 51/004* (2013.01); *H01L 41/113* (2013.01)

(58) Field of Classification Search
CPC ....... H01L 35/32; H01L 51/004; H01L 35/22; H01L 41/113
See application file for complete search history.

(56) References Cited

U.S. PATENT DOCUMENTS

| 4,149,025 A | 4/1979 | Niculescu |
| 2002/0158342 A1 | 10/2002 | Tuominen et al. |

(Continued)

FOREIGN PATENT DOCUMENTS

| EP | 2400574 A1 | 12/2011 |
| JP | 4199755 A | 7/1992 |

(Continued)

OTHER PUBLICATIONS

Carroll et al., "Multilayered Carbon Nanotube/Polymer Composite Based Thermoelectric Fabrics," Nano Lett. 2012, 12, 1307-1310.*

(Continued)

*Primary Examiner* — Angelo Trivisonno
(74) *Attorney, Agent, or Firm* — Nexsen Pruet, PLLC; J. Clinton Wimbish

(57) ABSTRACT

In one aspect, thermoelectric apparatus and articles and various applications of thermoelectric apparatus and articles are described herein. In some embodiments, a thermoelectric apparatus described herein comprises at least one p-type layer coupled to at least one n-type layer to provide a pn junction, and an insulating layer at least partially disposed between the p-type layer and the n-type layer, the p-type layer comprising carbon nanoparticles and the n-type layer comprising n-doped carbon nanoparticles. In some embodiments, the nanoparticles of the p-type layer and/or the nanoparticles of the n-type layer are disposed in a polymeric matrix comprising electrically poled polymer. In some embodiments, a thermoelectric article comprises a thermally insulating support and thermoelectric modules formed of a structure passing around or through the thermally insulating (Continued)

support to provide faces of the thermoelectric modules on opposing sides of the thermally insulating support.

28 Claims, 9 Drawing Sheets

(51) Int. Cl.
*H01L 35/22* (2006.01)
*H01L 51/00* (2006.01)
*H01L 41/113* (2006.01)

(56) References Cited

U.S. PATENT DOCUMENTS

| | | | |
|---|---|---|---|
| 2004/0031515 | A1 | 2/2004 | Sadatomi et al. |
| 2005/0205125 | A1* | 9/2005 | Nersessian ............... H02N 2/18 136/205 |
| 2005/0231893 | A1 | 10/2005 | Harvey |
| 2006/0102224 | A1* | 5/2006 | Chen ...................... H01L 35/16 136/203 |
| 2009/0044848 | A1 | 2/2009 | Lashmore et al. |
| 2010/0116308 | A1 | 5/2010 | Hayashi et al. |
| 2010/0219383 | A1* | 9/2010 | Eklund ................... B82Y 10/00 252/516 |
| 2010/0231046 | A1 | 9/2010 | Doraisamy |
| 2010/0319750 | A1 | 12/2010 | Meng et al. |
| 2012/0133210 | A1 | 5/2012 | Moon et al. |
| 2012/0133247 | A1 | 5/2012 | Lee et al. |

FOREIGN PATENT DOCUMENTS

| | | |
|---|---|---|
| WO | 2005098981 A1 | 10/2005 |
| WO | 20090150690 A1 | 12/2009 |
| WO | 2012054504 A2 | 4/2012 |

OTHER PUBLICATIONS

Kenney & Roth, "Room Temperature Poling of Poly(Vinylidene Fluoride) with Deposited Metal Electrodes," Journal of Research of the National Bureau of Standards, vol. 84, No. 6, Nov.-Dec. 1979.*
V. Corral-Flores and D. Bueno-Baqués (2011). Flexible Ferroelectric BaTiO3—PVDF Nanocomposites, Ferroelectrics—Material Aspects, Dr. Lallart (Ed.), ISBN: 978-953-307-332-3, InTech, Available from: http://www.intechopen.com/books/ferroelectrics-material-aspects/flexible-ferroelectric-batio3-pvdfnanocomposites.*
Park et al., "Piezoelectric BaTiO3 Thin Film Nanogenerator on Plastic Substrates," Nano Lett., 2010, 10 (12), pp. 4939-4943.*
Zhong et al., "Synthesis of high nitrogen doping of carbon nanotubes and modeling the stabilization of filled DAATO@CNTs (10,10) for nanoenergetic materials," Journal of Physics and Chemistry of Solids 71 (2010) 134-139.*
Carroll et al., "Multilayered Carbon Nanotube/Polymer Composite Based Thermoelectric Fabrics," Nano Lett. 2012, 12, 1307-1310. (Year: 2012).*
Kenney & Roth, "Room Temperature Poling of Poly(Vinylidene Fluoride) with Deposited Metal Electrodes," Journal of Research of the National Bureau of Standards, vol. 84, No. 6, Nov.-Dec. 1979. (Year: 1979).*
V. Corral-Flores and D. Bueno-Baqués (2011). Flexible Ferroelectric BaTiO3—PVDF Nanocomposites,Ferroelectrics—Material Aspects, Dr. Lallart (Ed.), ISBN: 978-953-307-332-3, InTech (Year: 2011).*
Park et al., "Piezoelectric BaTiO3 Thin Film Nanogenerator on Plastic Substrates," Nano Lett., 2010, 10 (12), pp. 4939-4943. (Year: 2010).*
Zhong et al., "Synthesis of high nitrogen doping of carbon nanotubes and modeling the stabilization of filled DAATO@CNTs (10,10) for nanoenergetic materials," Journal of Physics and Chemistry of Solids 71 (2010) 134-139. (Year: 2010).*
Notification Concerning Transmittal of International Preliminary Report on Patentability for corresponding PCT Application No. PCT/US2014/027486, dated Sep. 24, 2015, 13 pages.
Hewitt, Corey A. et al., Multilayered Carbon Nanotube/Polymer Composite Based Thermoelectric Fabrics, Nano Letters, vol. 12, No. 3, Mar. 14, 2012, pp. 1307-1310.
Levi, Nicole et al., Properties of Polyvinylidene Difluoride-Carbon Nanotube Blends, Nano Letters, American Chemical Society, US, vol. 4, No. 7, Jun. 16, 2004, pp. 1267-1271.
Gomes, J. et al., Influence of the β-phase content and degree of crystallinity of the piezo- and ferroelctric properties of poly(vinylidene fluoride), Smart Materials and Structures, IOP Publishing Ltd., Bristol GB, vol. 19, No. 6, Apr. 30, 2010, 7 pages.
International Search Report and Written Opinion dated Oct. 24, 2014 for PCT/US2014/027486, 17 pages.
International Search Report and Written Opinion of PCT/US2011/056740 dated Nov. 19, 2012; 14 pgs.
Kim et al, "Improved Thermoelectric Behavior of Nanotube-Filled Polymer Composites with Poly (3,4-ethylenedioxythiophene) Poly (styrenesufonate)", ACS Nano, Jan. 26, 2010, pgs. 513-523, vol. 4, No. 1.
Choi et al. "Effect of the carbon nanotube type on the thermoelectric properties of CNT/Nafion nanocomposites"); Organic Electronics 12 (2011) 2120-2125; available online Sep. 13, 2011.

* cited by examiner

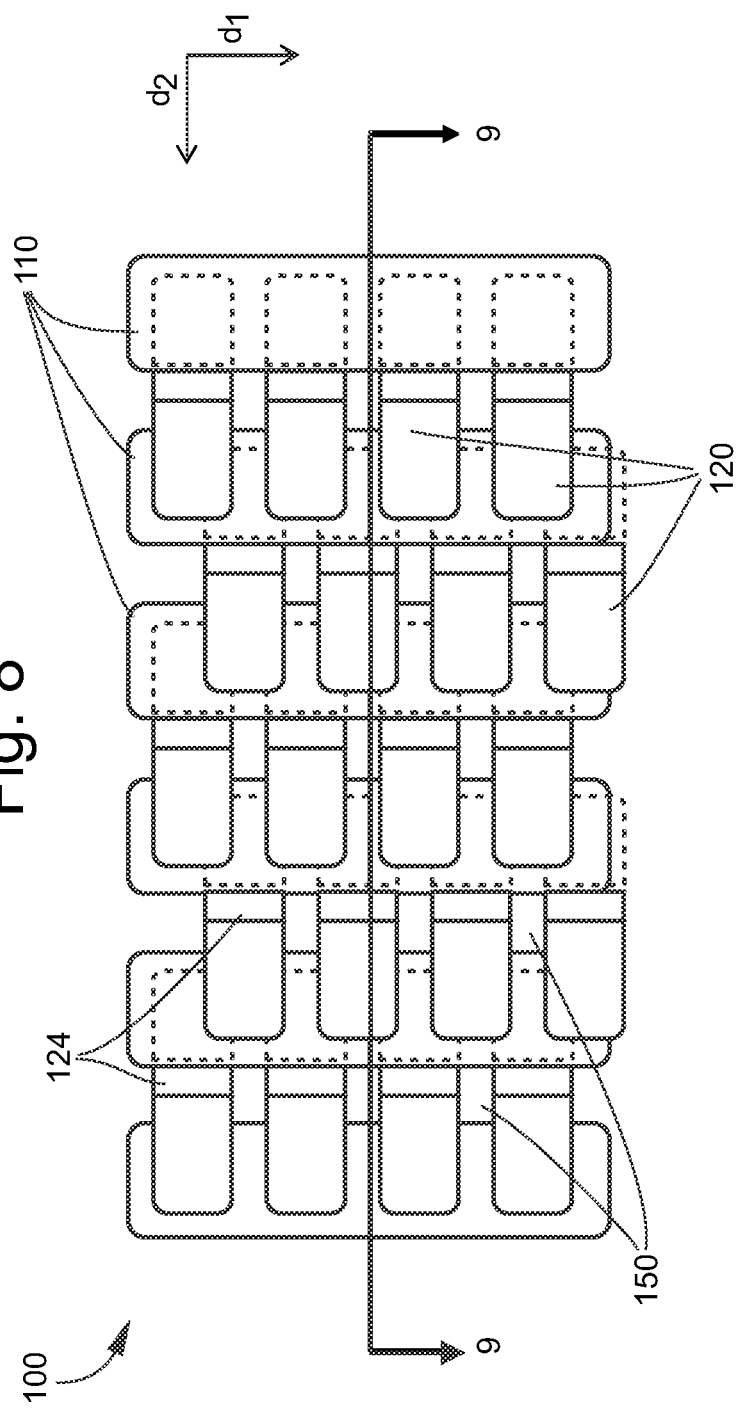
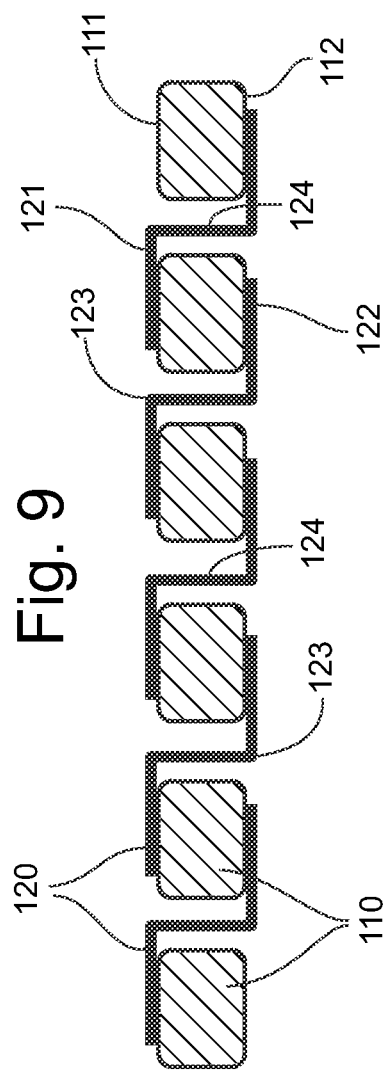

THERMOELECTRIC APPARATUS AND ARTICLES AND APPLICATIONS THEREOF

CROSS REFERENCE TO RELATED APPLICATIONS

This application is a U.S. National Phase of PCT/US2014/027486, filed Mar. 14, 2014, which claims priority pursuant to 35 U.S.C. § 119(e) to U.S. Provisional Patent Application Ser. No. 61/783,709, filed on Mar. 14, 2013, and to U.S. Provisional Patent Application Ser. No. 61/808,472, filed on Apr. 4, 2013, which are hereby incorporated by reference in their entireties.

FIELD

The present invention relates to thermoelectric materials and, in particular, to apparatus, articles, and fabrics incorporating thermoelectric materials.

BACKGROUND OF THE INVENTION

Heat energy is widely used in the generation of electricity. However, the efficiency of converting heat energy into electrical energy by current methods is low, ranging from about 30 to 40 percent. As a result, a significant amount of heat energy escapes into the environment as waste. It is estimated that about 15 terawatts of power is lost to the environment in the annual global production of electricity.

Thermoelectric materials are operable to capture heat for additional electrical production. Thermoelectric efficiency is quantified by the Figure of Merit, ZT.

Thermoelectric materials demonstrating higher ZT values have higher thermoelectric efficiencies. Fabricating thermoelectric materials with reasonable ZT values is often difficult and/or expensive. Bismuth chalcogenides, for example, provide excellent thermoelectric properties with ZT values ranging from 0.7 to 1.0. These materials can be nanostructured to produce a superlattice structure of alternating $Bi_2Te_3$ and $Bi_2Se_3$ layers resulting in a material having acceptable electrical conductivity and poor thermal conductivity. Fabrication of these materials, nevertheless, can be time consuming and expensive.

Moreover, as a result of fabrication requirements and other material tolerances, many thermoelectric materials do not lend themselves to facile incorporation into a wide variety of devices for heat collection and electrical generation.

SUMMARY

In one aspect, thermoelectric apparatus are described herein which, in some embodiments, can overcome or mitigate one or more disadvantages of current thermoelectric materials. In some embodiments, a thermoelectric apparatus described herein comprises at least one p-type layer coupled to at least one n-type layer to provide a pn junction, and an insulating layer at least partially disposed between the p-type layer and the n-type layer, the p-type layer comprising carbon nanoparticles and the n-type layer comprising n-doped carbon nanoparticles. Carbon nanoparticles of the p-type layer can be p-doped. Nanoparticles of the p-type layer and/or nanoparticles of the n-type layer can be disposed in polymeric matrices comprising electrically poled polymer. Additionally, the insulating layer can comprise electrically poled polymer or electrically poled particles demonstrating piezoelectric behavior, such as barium titanate ($BaTiO_3$) particles, bismuth telluride particles (BiTe), other inorganic particles or mixtures thereof.

Electrically poled polymer and/or piezoelectric particles of apparatus described herein can comprise non-randomly oriented electric dipoles and/or electric dipole domains. Moreover, electrically poled polymer and/or particles can also exhibit an electric dipole field oriented parallel or substantially parallel to an axis of current flow in the thermoelectric apparatus as well as exhibiting piezoelectric/pyroelectric behavior. The piezoelectric and/or pyroelectric properties of electrically poled compositions described herein can permit thermoelectric apparatus incorporating such compositions to provide electrical output resulting from mechanical deformations in addition to the electrical output resulting from exposure to thermal gradients.

In some embodiments, a thermoelectric apparatus described herein comprises a plurality of p-type layers coupled to a plurality of n-type layers providing a plurality of pn junctions, and insulating layers at least partially disposed between the p-type layers and the n-type layers, wherein at least one p-type layer comprises carbon nanoparticles and at least one n-type layer comprises n-doped carbon nanoparticles. P-type layers, n-type layers and/or insulating layers of the thermoelectric apparatus can include electrically poled polymer. Further, p-type layers and n-type layers can be arranged in a stacked configuration with the insulating layers therebetween.

As described further herein, pn junctions can be formed at interfaces of the p-type layers and the n-type layers. In some embodiments, an interfacial transition region exists at a pn junction formed by a p-type layer in contact with an n-type layer. The interfacial transition region comprises nanoparticles of the p-type layer mixing with nanoparticles of the n-type layer. Mixing of nanoparticles of the p-type and n-type layers can provide a pn junction of heterogeneous structure. Alternatively, a metallic interlayer can be disposed between a p-type layer and n-type layer of a pn junction. Further, pn junctions of apparatus described herein can serve as rectifiers for voltage output associated with the piezoelectric and/or pyroelectric behavior of poled polymeric matrices described herein.

In some embodiments of a thermoelectric apparatus described herein, carbon nanoparticles including p-doped and n-doped carbon nanotubes can be substituted with one or more inorganic semiconductor nanoparticles. In some embodiments, inorganic semiconductor nanoparticles comprise group IV materials, group II/VI materials or group III/V materials or combinations thereof. In some embodiments, inorganic semiconductor nanoparticles comprise quantum dots and/or nanowires. In some embodiments, inorganic semiconductor nanoparticles have dimensions consistent with any of the carbon nanoparticles described herein.

In another aspect, a photo-thermal apparatus is described herein comprising a photovoltaic component and a thermoelectric component, the thermoelectric component comprising at least one p-type layer coupled to at least one n-type layer to provide a pn junction, and an insulating layer at least partially disposed between the p-type layer and the n-type layer, the p-type layer comprising carbon nanoparticles and the n-type layer comprising n-doped carbon nanoparticles. In some embodiments, the nanoparticles of the p-type layer and/or the nanoparticles of the n-type layer are disposed in a polymeric matrix comprising an electrically poled polymer. Additionally, the insulating layer can comprise electrically poled polymer or electrically poled particles demonstrating piezoelectric behavior.

Further, in some embodiments, the thermoelectric component comprises a plurality of p-type layers coupled to a plurality of n-type layers providing a plurality of pn junctions, and insulating layers at least partially disposed between the p-type layers and the n-type layers. As described herein, a pn junction can comprise a heterogeneous interfacial transition region formed by nanoparticles of the p-type layer mixing with nanoparticles of the n-type layer. Additionally, a metallic interlayer can be disposed between the p-type and n-type layers of a pn junction.

A photo-thermal apparatus can further comprise a Stokes shift layer positioned between the photovoltaic component and the thermoelectric component. The Stokes shift layer comprises one or more Stokes shift chemical species operable to create heat energy for transmission to the adjacent side of the thermoelectric component. In some embodiments, Stokes shift chemical species absorb electromagnetic radiation that has passed through the photovoltaic component.

Moreover, in some embodiments, radiation emitted by one or more Stokes shift chemical species is absorbed by the photovoltaic component.

In another aspect, methods of making a thermoelectric apparatus are described herein. In some embodiments, a method of making a thermoelectric apparatus comprises providing at least one p-type layer comprising carbon nanoparticles disposed in a first polymeric matrix, providing at least one n-type layer comprising n-doped carbon nanoparticles disposed in a second polymeric matrix, positioning an insulating layer between the p-type layer and the n-type layer, and coupling the p-type layer and the n-type layer to provide a pn junction. The first polymeric matrix and/or the second polymeric matrix can be electrically poled to provide at least partial alignment of dipole domains in the first and/or second polymeric matrices. Further, the insulating layer can be electrically poled to provide at least partial alignment of dipole domains in the insulating layer. Dipole domains of the insulating layer can comprise crystalline or semicrystalline domains of a polymeric material and/or discrete particles, such as $BaTiO_3$ particles, demonstrating piezoelectric behavior. Poling can comprise press fitting one or more interdigitated arrays along the length of the p-type layer and/or n-type layer and applying a poling voltage to the arrays. Coupling the p-type layer and the n-type layer to provide a pn junction can form a heterogeneous interfacial transition region at the interface of the p-type and n-type layers. Alternatively, a metallic interlayer can be positioned between the p-type and n-type layers at the junction location.

In some embodiments of methods described herein, a plurality of p-type layers and n-type layers are provided and coupled to one another resulting in the formation of a plurality of pn junctions. In some embodiments, insulating layers are positioned between the p-type layers and the n-type layers, wherein the p-type layers and n-type layers are in a stacked configuration. Polymer of the stacked p-type layers, n-type layers and/or insulating layer can comprise electrically poled polymer or electrically poled piezoelectric particles.

In another aspect, methods of making a photo-thermal apparatus are described herein. In some embodiments, a method of making a photo-thermal apparatus comprises providing a photovoltaic component, providing a thermoelectric component and coupling the photovoltaic component and the thermoelectric component, the thermoelectric component comprising at least one p-type layer coupled to at least one n-type layer to provide a pn junction, and an insulating layer at least partially disposed between the p-type layer and the n-type layer, the p-type layer comprising carbon nanoparticles and the n-type layer comprising n-doped carbon nanoparticles. In some embodiments, the thermoelectric component comprises a plurality of p-type layers coupled to a plurality of n-type layers to provide a plurality of pn junctions as described herein.

In some embodiments, a method of making a photothermal apparatus further comprises disposing a Stokes shift layer between the photovoltaic component and the thermoelectric component.

In another aspect, a method of converting electromagnetic energy into electrical energy is described herein. In some embodiments, a method of converting electromagnetic energy into electrical energy comprises providing an apparatus comprising a photovoltaic component and a thermoelectric component coupled to the photovoltaic component, the thermoelectric component comprising at least one p-type layer coupled to at least one n-type layer to provide a pn junction, and an insulating layer at least partially disposed between the p-type layer and the n-type layer, the p-type layer comprising carbon nanoparticles and the n-type layer comprising n-doped carbon nanoparticles. Electromagnetic radiation is absorbed by the photovoltaic component to provide a photocurrent and to heat one side of the thermoelectric component inducing a voltage across the thermoelectric component. Further, in some embodiments, nanoparticles of the at least one p-type layer and/or the nanoparticles of the at least one n-type layer of the thermoelectric component are disposed in an electrically poled polymeric matrix. Additionally, insulating layer(s) of the thermoelectric component can comprise electrically poled polymer and/or electrically poled piezoelectric particles.

In some embodiments, heating one side of the thermoelectric component comprises transferring heat generated in the photovoltaic component to one side of the thermoelectric component. Additionally, in some embodiments, heating one side of the thermoelectric component comprises providing a Stokes shift layer between the photovoltaic component and the thermoelectric component, absorbing electromagnetic radiation with the Stokes shift layer to generate heat and electromagnetic radiation and transferring the generated heat to one side of the thermoelectric component. In some embodiments, the electromagnetic radiation generated by the Stokes shift layer is transmitted to the photovoltaic component for the generation of photocurrent.

In yet another aspect, thermoelectric articles are described herein which, in some embodiments, can overcome or mitigate one or more disadvantages of current thermoelectric articles. For example, in some embodiments, articles described herein can be used to efficiently convert thermal energy into electrical energy, including when the articles are disposed on a non-planar surface or surface of complex geometry. In some embodiments, a thermoelectric article described herein can be used as or incorporated into an article of clothing. An article described herein can also be used as a covering for an electronic device such as a mobile phone or tablet device. Moreover, in some embodiments, an article described herein can be disposed on or contacted with the skin of a human user or the surface of an electronic device in a conformal or substantially conformal manner enabling the thermoelectric article to generate electrical energy from excess heat generated by a human body or an electronic device.

In some embodiments, an article described herein comprises a thermally insulating support and thermoelectric modules formed of a structure passing around or through the thermally insulating support to provide faces of the thermoelectric modules on opposing sides of the thermally insulating support. In some embodiments, the structure of thermoelectric modules is continuous. The continuous structure can be electrically conductive. Moreover, the continuous structure can comprise p-type layers coupled to n-type layers forming pn junctions, wherein insulating layers are partially disposed between the p-type layers and the n-type layers. Further, in some embodiments, p-type layers and n-type layers at the faces of the thermoelectric modules are substantially parallel to the opposing sides of the thermally insulating support. Additionally, a segment of the continuous structure of thermoelectric modules passing around or through an insulating support can be substantially normal to at least one of the faces of the thermoelectric modules.

P-type layers of a thermoelectric module structure described herein can comprise carbon nanoparticles while n-type layers of the structure comprise n-doped carbon nanoparticles. Moreover, carbon nanoparticles of the p-type layer can be p-doped. Nanoparticles of a p-type layer and/or nanoparticles of an n-type layer can also be disposed in polymeric matrices of electrically poled polymer. Additionally, an insulating layer of a thermoelectric module structure described herein can comprise electrically poled polymer or electrically poled particles demonstrating piezoelectric behavior, such as barium titanate ($BaTiO_3$) particles, bismuth telluride particles (BiTe), other inorganic particles or mixtures thereof.

Electrically poled polymer and/or piezoelectric particles of structures described herein can comprise non-randomly oriented electric dipoles and/or electric dipole domains. Electrically poled polymer and/or particles can also exhibit an electric dipole field oriented parallel or substantially parallel to an axis of current flow in the thermoelectric module as well as exhibiting piezoelectric/pyroelectric behavior. The piezoelectric and/or pyroelectric properties of electrically poled compositions described herein can permit articles incorporating such compositions to provide electrical output resulting from mechanical deformations in addition to the electrical output resulting from exposure to thermal gradients.

In another aspect, thermoelectric fabrics are described herein. In some embodiments, a fabric described herein comprises a thermoelectric article described hereinabove, wherein the thermally insulating support of the article comprises one or more fibers of a fabric. For example, in some embodiments, a fabric described herein comprises one or more thermally insulating fibers and thermoelectric modules formed of a structure passing around or through the thermally insulating fibers to provide faces of the thermoelectric modules on opposing sides of the thermally insulating fibers.

In yet another aspect, methods of making an article are described herein. In some embodiments, a method of making an article comprises providing a thermally insulating support and passing a structure of thermoelectric modules around or through the thermally insulating support to provide faces of the thermoelectric modules on opposing sides of the thermally insulating support. In some embodiments, the structure of thermoelectric modules is continuous. Further, a continuous thermoelectric module structure comprises p-type layers coupled to n-type layers forming pn junctions, wherein insulating layers are partially disposed between the p-type layers and the n-type layers. In addition, p-type layers and n-type layers at the faces of the thermoelectric modules can be substantially parallel to the opposing sides of the thermally insulating support. Moreover, the thermally insulating support can be one or more fibers of a fabric.

Further, passing the structure of thermoelectric modules around or through the thermally insulating support can further comprise providing a segment of the thermoelectric structure substantially normal to at least one of the faces of the thermoelectric modules. Additionally, in some embodiments, thermoelectric modules of the article can be connected in parallel.

In another aspect, methods of producing electrical energy are described herein. In some embodiments, a method of converting thermal energy into electrical energy comprises providing an article comprising a thermally insulating support and thermoelectric modules formed of a structure passing around or through the thermally insulating support to provide faces of the thermoelectric modules on opposing sides of the thermally insulating support. Thermal energy is absorbed by the thermoelectric modules to induce a voltage across the thermoelectric modules. Additionally, thermoelectric modules of the article, in some embodiments, demonstrate piezoelectric/pyroelectric properties permitting generation of electrical energy in response to mechanical fluctuations or stresses on the article.

These and other embodiments are described in greater detail in the detailed description which follows.

BRIEF DESCRIPTION OF THE FIGURES

FIG. 8 illustrates a plan view of a thermoelectric article according to one embodiment described herein.

FIG. 9 illustrates a cross-sectional view of the article of FIG. 8 taken along lines 9-9.

DETAILED DESCRIPTION

Figure 1:
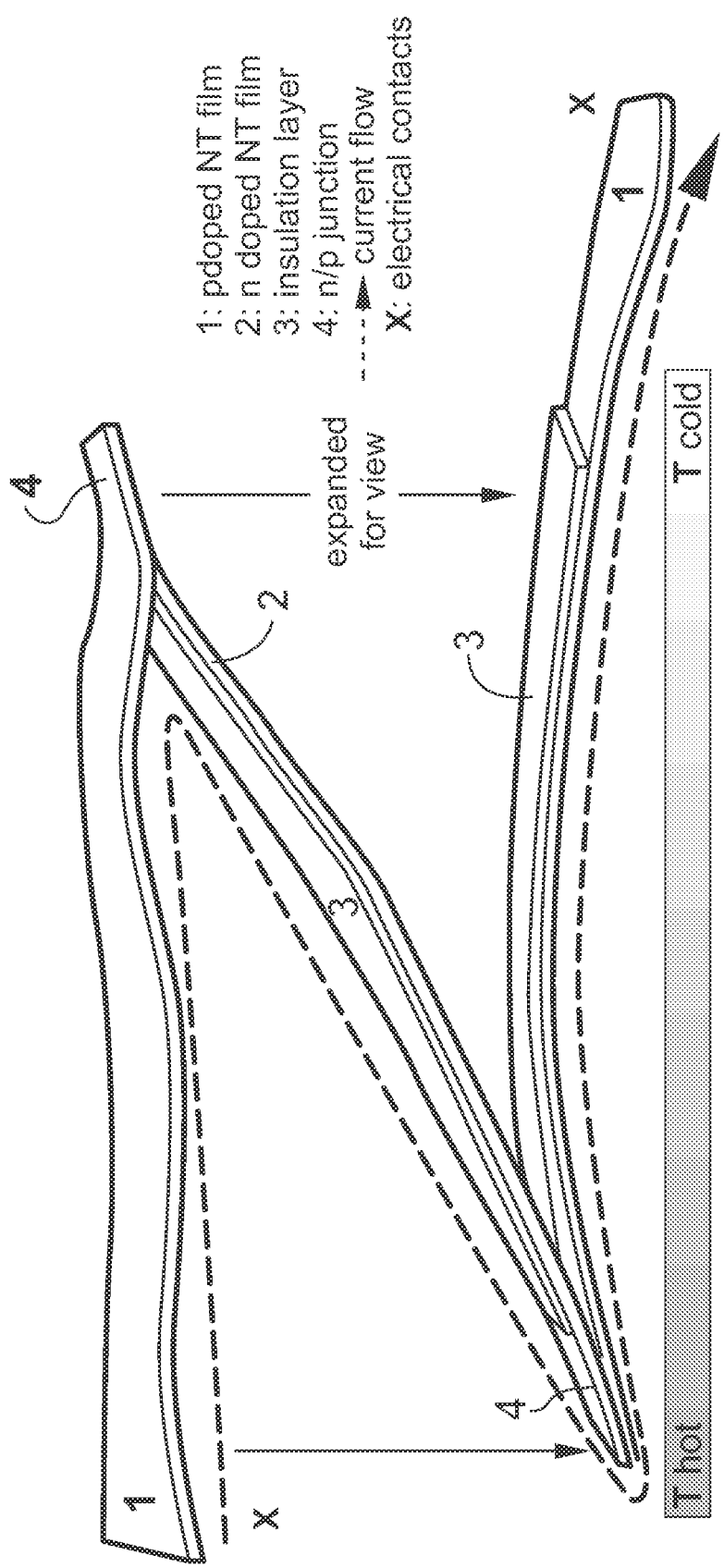
FIG. 1 illustrates a side expanded view of a thermoelectric apparatus or thermoelectric module according to one embodiment described herein.

Embodiments described herein can be understood more readily by reference to the following detailed description, examples and drawings. Elements, apparatus, and methods described herein, however, are not limited to the specific embodiments presented in the detailed description, examples and drawings. It should be recognized that these embodiments are merely illustrative of the principles of the present invention. Numerous modifications and adaptations will be readily apparent to those of skill in the art without departing from the spirit and scope of the invention.

In addition, all ranges disclosed herein are to be understood to encompass any and all subranges subsumed therein. For example, a stated range of "1.0 to 10.0" should be considered to include any and all subranges beginning with a minimum value of 1.0 or more and ending with a maximum value of 10.0 or less, e.g., 1.0 to 5.3, or 4.7 to 10.0, or 3.6 to 7.9.

All ranges disclosed herein are also to be considered to include the end points of the range, unless expressly stated otherwise. For example, a range of "between 5 and 10" should generally be considered to include the end points 5 and 10.

Further, when the phrase "up to" is used in connection with an amount, it is to be understood that the amount is at least a detectable amount. For example, a material present in an amount "up to" a specified amount can be present from a detectable amount and up to and including the specified amount.

I. Thermoelectric Apparatus

In one aspect, thermoelectric apparatus are described herein. A thermoelectric apparatus described herein comprises at least one p-type layer coupled to at least one n-type layer to provide a pn junction, and an insulating layer at least partially disposed between the p-type layer and the n-type layer, the p-type layer comprising carbon nanoparticles and the n-type layer comprising n-doped carbon nanoparticles. In some embodiments, carbon nanoparticles of the p-type layer are p-doped. Nanoparticles of the p-type layer and/or nanoparticles of the n-type layer can be disposed in polymeric matrices comprising electrically poled polymer. Additionally, the insulating layer can comprise electrically poled polymer or electrically poled particles demonstrating piezoelectric behavior. Electrically poled polymer and/or piezoelectric particles of apparatus described herein can comprise non-randomly oriented electric dipoles and/or electric dipole domains. Moreover, electrically poled polymer and/or particles can also exhibit an electric dipole field oriented parallel or substantially parallel to an axis of current flow in the thermoelectric apparatus as well as exhibiting piezoelectric/pyroelectric behavior. The piezoelectric and/or pyroelectric properties of electrically poled compositions described herein can permit thermoelectric apparatus incorporating such compositions to provide electrical output resulting from mechanical deformations in addition to the electrical output resulting from exposure to thermal gradients.

Further, in some embodiments, p-type layers, n-type layers or insulating layers of a thermoelectric apparatus herein exhibit a pyroelectric field. The pyroelectric field can have any orientation not inconsistent with the objectives of the present invention. For example, a pyroelectric field can be oriented parallel or substantially parallel to an axis of current flow in the apparatus.

In some embodiments, a thermoelectric apparatus described herein comprises a plurality of p-type layers coupled to a plurality of n-type layers providing a plurality of pn junctions, and insulating layers at least partially disposed between the p-type layers and the n-type layers, wherein at least one p-type layer comprises carbon nanoparticles and at least one n-type layer comprises n-doped carbon nanoparticles. In addition, p-type layers, n-type layers or insulating layers can comprise electrically poled polymer. In some embodiments, p-type layers and n-type layers of a thermoelectric apparatus described herein are in a stacked configuration.

Figure 6:
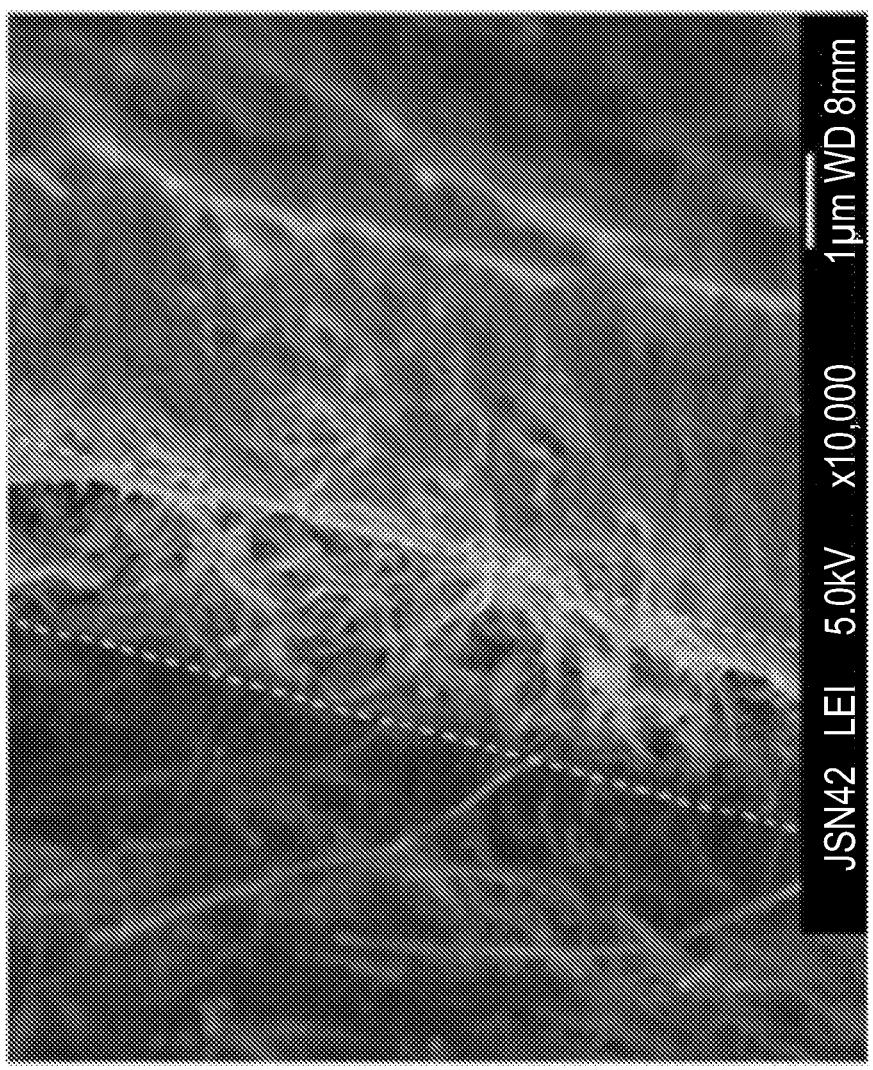
FIG. 6 illustrates a heterogeneous interfacial transition region of a pn junction of a thermoelectric apparatus or thermoelectric module according to one embodiment described herein.

As described herein, bringing a p-type layer and n-type layer into contact creates a pn-junction. In some embodiments, an interfacial transition region is present at a pn junction formed by a p-type layer in contact with an n-type layer. The interfacial transition region comprises nanoparticles of the p-type layer and the n-type layer mixing. Mixing of nanoparticles of the p-type and n-type layers can provide a pn junction of heterogeneous structure. FIG. 6 illustrates a heterogeneous interfacial transition region of a pn junction of a thermoelectric apparatus according to one embodiment described herein.

Additionally, a metallic interlayer can be disposed between a p-type layer and an n-type layer of a pn junction. A metallic interlayer can be formed of any metal not inconsistent with the objectives of the present invention. For example, a metallic interlayer can be formed of a noble metal including gold, platinum, iridium, palladium, osmium, silver, rhodium or ruthenium or alloys thereof. A metallic interlayer may also be formed from aluminum, nickel, copper, other transition metals or transition metal alloys. Further, a metallic interlayer may be formed of an organic material demonstrating metallic properties such as graphite or graphene.

A metallic interlayer can serve as a pinning layer. A pinning layer, in some embodiments, pins the Fermi levels of the adjacent n-type layer and p-type layer. Moreover, a pinning layer described herein can be energetically matched to the n-type layer or the p-type layer.

Figure 7:
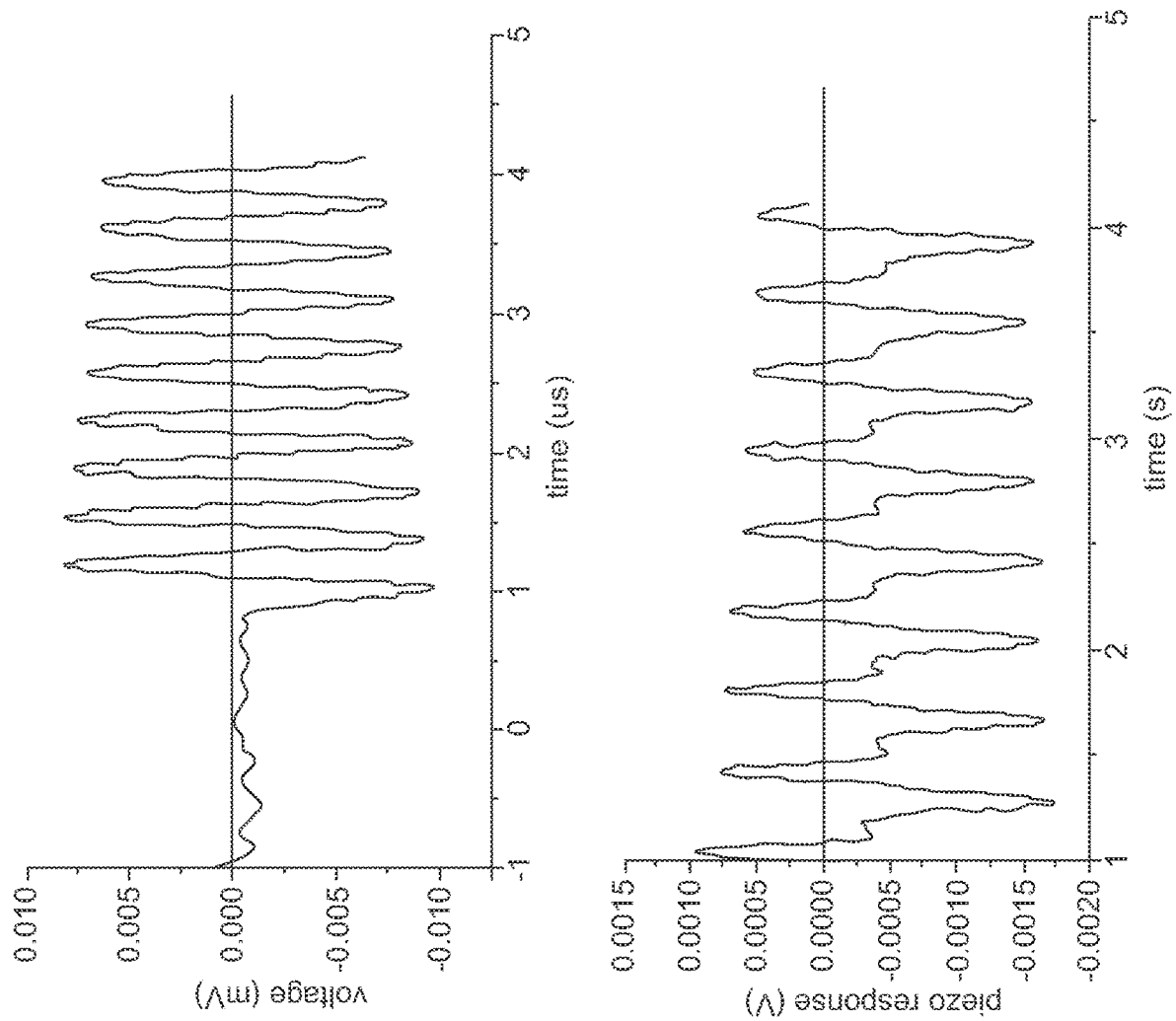
FIG. 7 illustrates voltage outputs of poled polymeric composite films of thermoelectric apparatus or thermoelectric module described herein and rectification of such outputs by pn junctions formed by the composite films.

In some embodiments, pn junctions of the thermoelectric apparatus described herein can serve as rectifiers for voltage output(s) associated with piezoelectric and/or pyroelectric behavior of poled polymeric constructions of the apparatus. FIG. 7 illustrates rectification of poled piezoelectric films employed in thermoelectric apparatus described herein. Electrically poled PVDF films comprising carbon nanotubes were provided and suspended in a vacuum system of $10^{-6}$ torr with a cold block attached to a freely hanging end of the film (connected to an angel hair thermocouple and a thin power lead). A heater block supported the films and included heating coils controlled externally by computer along with a thermocouple. The films were allowed to swing freely like a pendulum from a predefined starting position from which they were released. The decay of the swing was used to determine mechanical properties and thermoelectric power in conjunction with piezo-electric power. FIG. 7 illustrates results of the testing. The top graph of FIG. 7 illustrates the voltage output of a single poled PVDF film swinging back and forth. The symmetrical nature of the voltage output is expected. However, the bottom graph of FIG. 7 illustrates the voltage output of poled p-type and n-type PVDF films brought into contact to form a pn junction. The asymmetric voltage output of the pair of films is characteristic of rectification by the pn junction. Such rectification can be exploited to extract power from thermoelectric apparatus described herein resulting from various mechanical distortions of the apparatus that would otherwise be canceled out by randomness in the directional application of the mechanical distortions.

FIG. 1 illustrates an expanded side view of a thermoelectric apparatus according to one embodiment described herein. The thermoelectric apparatus illustrated in FIG. 1 comprises two p-type layers (1) coupled to an n-type layer (2) in an alternating fashion. The alternating coupling of p-type (1) and n-type (2) layers provides the thermoelectric apparatus a z-type configuration having pn junctions (4) on opposite sides of the apparatus. Insulating layers (3) are disposed between interfaces of the p-type layers (1) and the n-type layer (2) as the p-type (1) and n-type (2) layers are in a stacked configuration. As described herein, the thermoelectric apparatus provided in FIG. 1 is in an expanded state to facilitate illustration and understanding of the various components of the apparatus. In some embodiments, however, the thermoelectric apparatus is not in an expanded state such that the insulating layers (3) are in contact with a p-type layer (1) and an n-type layer (2).

FIG. 1 additionally illustrates the current flow through the thermoelectric apparatus induced by exposing one side of the apparatus to a heat source. Electrical contacts (X) are provided to the thermoelectric apparatus for application of the thermally generated current to an external load.

Figure 2:
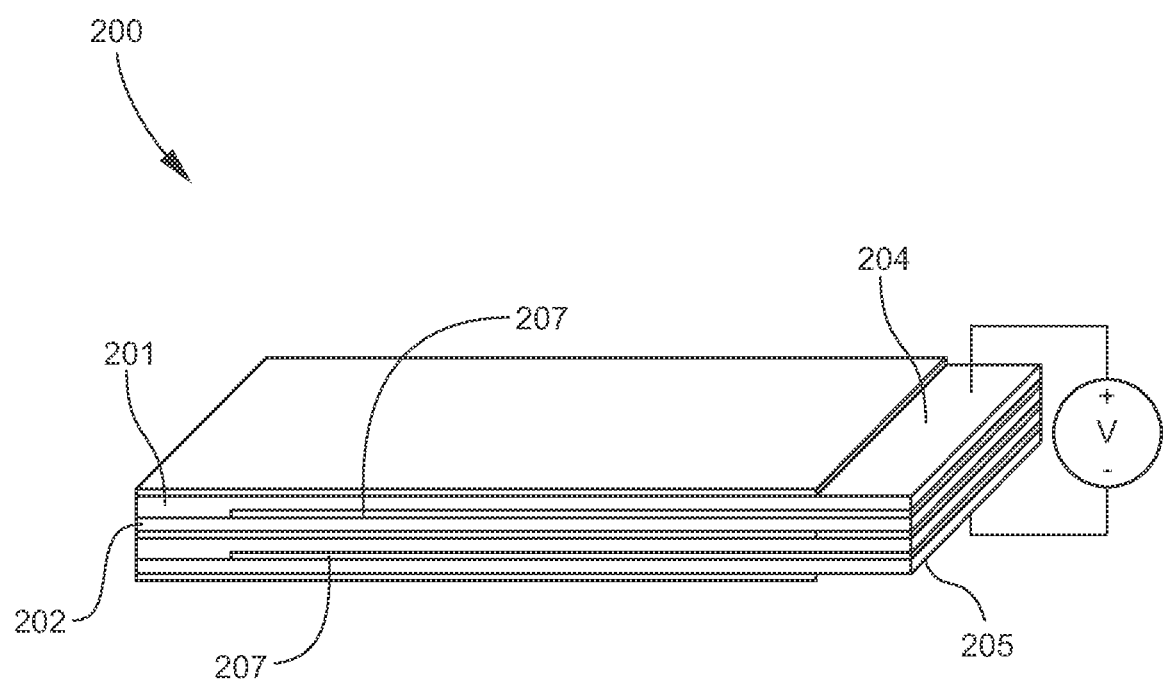
FIG. 2 illustrates perspective view of a thermoelectric apparatus or thermoelectric module according to one embodiment described herein.

FIG. 2 illustrates a thermoelectric apparatus (200) according to one embodiment described herein wherein the p-type layers (201) and the n-type layers (202) are in a stacked configuration. The p-type layers (201) and the n-type layers (202) are separated by insulating layers (207) in the stacked configuration. The thermoelectric apparatus (200) is connected to an external load by electrical contacts (204, 205).

Turning now to components that can be included in the various embodiments of a thermoelectric apparatus described herein, a thermoelectric apparatus described herein comprises at least one p-type layer comprising carbon nanoparticles.

Carbon nanoparticles of a p-type layer, in some embodiments, comprise fullerenes, carbon nanotubes, or mixtures thereof. Fullerenes, in some embodiments, comprise 1-(3-methoxycarbonyl)propyl-1-phenyl(6,6)$C_{61}$ (PCBM). In some embodiments, carbon nanotubes comprise single-walled carbon nanotubes (SWNT), multi-walled carbon nanotubes (MWNT), as well as p-doped single-walled carbon nanotubes, p-doped multi-walled carbon nanotubes or mixtures thereof.

In some embodiments, p-doped single-walled carbon nanotubes and/or p-doped multi-walled carbon nanotubes comprise boron in an amount ranging from about 0.1 weight percent to about 30 weight percent. In some embodiments, p-doped single-walled carbon nanotubes and/or p-doped multi-walled carbon nanotubes comprise boron in an amount ranging from about 5 weight percent to about 25 weight percent or from about 10 weight percent to about 20 weight percent. In some embodiments, p-doped single-walled carbon nanotubes and/or p-doped multi-walled carbon nanotubes comprise boron in an amount less than about 0.1 weight percent. In some embodiments, p-doped single-walled carbon nanotubes and/or p-doped multi-walled carbon nanotubes comprise oxygen.

In some embodiments, a p-type dopant is incorporated in the lattice of single-walled and/or multi-walled carbon nanotubes. In some embodiments, a p-type dopant is externally provided to carbon nanotubes by the environment surrounding the single walled and/or multi-walled carbon nanotubes. As described further herein, carbon nanotubes of a p-type layer, in some embodiments, are disposed in a polymeric matrix. In some embodiments, the polymeric matrix can provide p-dopant to surfaces of the carbon nanotubes. In some embodiments, wherein the polymeric matrix provides p-dopant to surfaces of the carbon nanotubes, the carbon nanotubes are not p-doped prior to incorporation into the polymeric matrix. Alternatively, in some embodiments wherein the polymeric matrix provides p-dopant to surfaces of the carbon nanotubes, the carbon nanotubes comprise p-dopant prior to incorporation into the polymeric matrix. Moreover, in some embodiments, chemical species also disposed in the polymeric matrix, such as alkali metals, can serve as p-dopant for the carbon nanotubes.

In some embodiments, carbon nanoparticles of a p-type layer have a high aspect ratio. The term aspect ratio, as used herein, refers to a carbon nanoparticle's length divided by the carbon nanoparticle's diameter or width. In some embodiments, carbon nanoparticles of a p-type layer demonstrate an aspect ratio ranging from about 1 to about $10^6$. In some embodiments, carbon nanoparticles display an aspect ratio ranging from about 10 to about 100,000. In some embodiments, carbon nanoparticles have an aspect ratio ranging from about 10 to about 10,000 or from about 5 to about 1000.

Carbon nanoparticles of a p-type layer, including carbon nanotubes, in some embodiments, have a length ranging from about 1 nm to about 5 mm or from about 10 nm to about 1 mm. In some embodiments, carbon nanoparticles have a length ranging from about 50 nm to about 500 μm, from about 100 nm to about 100 μm, or from about 500 nm to about 10 μm. In some embodiments, carbon nanoparticles have a length ranging from about 200 μm to about 500 μm.

Carbon nanoparticles of a p-type layer, in some embodiments, have a diameter ranging from about 1 nm to about 100 nm. In some embodiments, carbon nanoparticles have a diameter ranging from about 10 nm to about 80 nm or from about 20 nm to about 60 nm. In some embodiments, carbon nanoparticles have a diameter greater than about 100 nm or less than about 1 nm.

In some embodiments, carbon nanoparticles of a p-type layer, including carbon nanotubes, are provided in a mat configuration.

A p-type layer, in some embodiments, comprises one or more species of carbon nanoparticles described herein in an amount ranging from about 0.1 weight percent to about 100 weight percent. In some embodiments, a p-type layer comprises carbon nanoparticles in an amount of at least about 2 weight percent. In some embodiments, a p-type layer comprises carbon nanoparticles in an amount of at least about 5 weight percent or at least about 10 weight percent. In some embodiments, a p-type layer comprises carbon nanoparticles in an amount ranging from about 2 weight percent to about 50 weight percent. In some embodiments, a p-type layer comprises carbon nanoparticles in an amount ranging from about 5 weight percent to about 30 weight percent.

Figure 3:
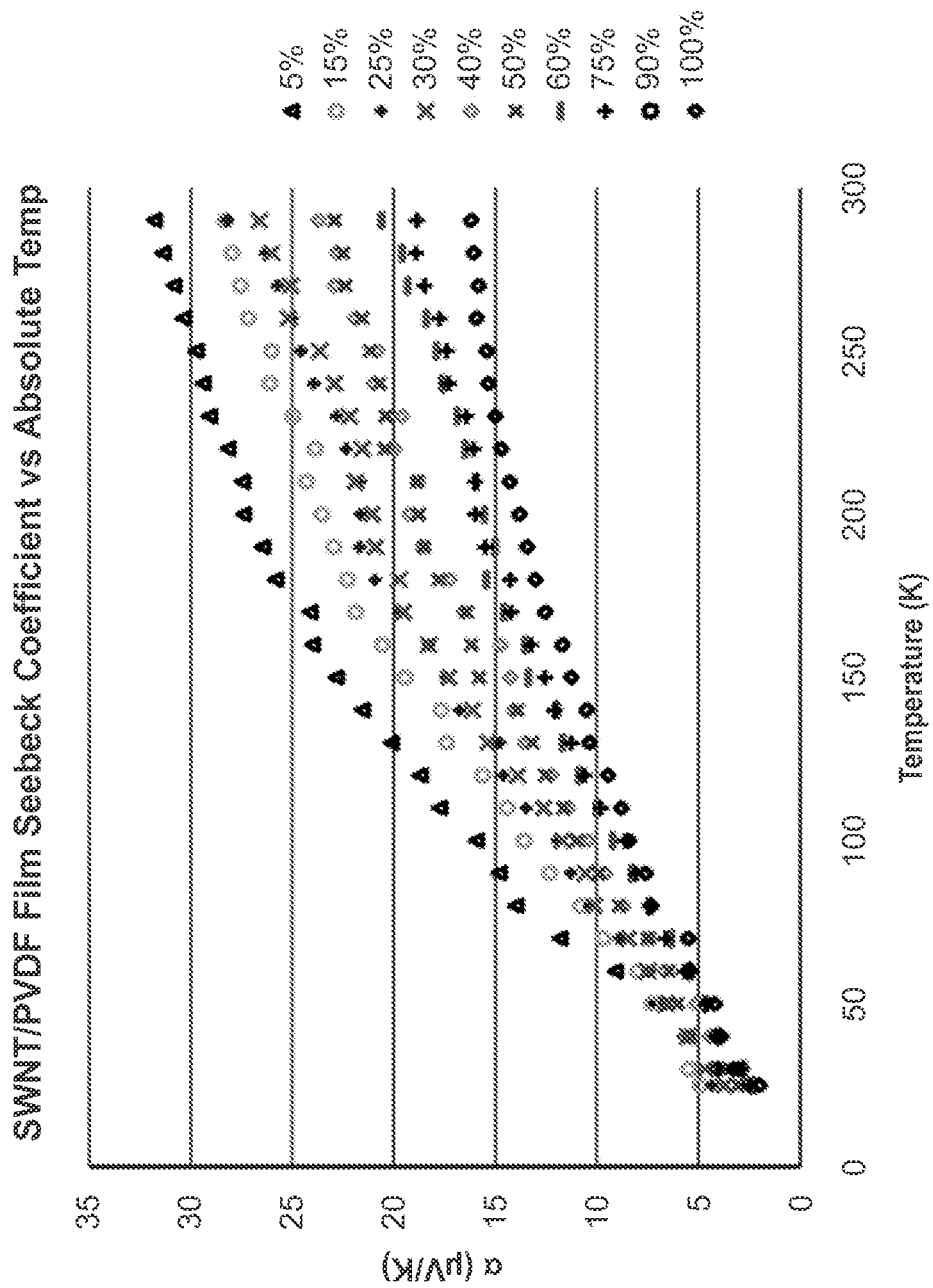
FIG. 3 illustrates Seebeck coefficient values for various carbon nanotube loadings in a polymeric matrix according to some embodiments described herein.

Carbon nanoparticle loadings of p-type layers described herein, in some embodiments, can be chosen with reference to the desired Seebeck coefficient of the layer. FIG. 3 illustrates Seebeck coefficient as a function of SWNT loading of a polyvinylidene fluoride (PVDF) matrix of p-type layers according to some embodiments described herein. As illustrated in FIG. 3, SWNT loadings ranging from 5 weight percent to 100 weight percent provide a range of Seebeck coefficients for the p-type layers.

While PVDF is referenced in FIG. 3, matrices of p-type layers can be formed of other polymeric species. Any polymeric material not inconsistent with the objectives of the present invention can be used in the production of a polymeric matrix for a p-type layer. In some embodiments, a polymeric matrix comprises semicrystalline polymer including, but not limited to, polyvinyl fluoride (PVF), polyvinylidene fluoride-trifluoroethylene (PVDF-TrFE), polyvinylidene fluoride-tetrafluoroethylene (PVDF-TFE), polytetrafluoroethylene (PTFE), or mixtures or copolymers thereof. Semicrystalline polymers of PVDF, PVDF-TFE and/or PVDF-TrFE used in p-type layers of the thermoelectric apparatus can demonstrate increased amounts of β-phase. For example, PVDF, PVDF-TFE and/or PVDF-TrFE of a p-type layer can display a phase ratio of β/α of 1.5 to 2.5. In some embodiments, the β/α phase ratio is 2 to 2.5. As discussed herein, β-phase crystallites can be provided a non-random orientation by poling techniques, thereby enhancing piezoelectric and pyroelectric properties of the polymeric matrix.

In some embodiments, a polymer matrix of a p-type layer comprises polyacrylic acid (PAA), polymethacrylate (PMA), polymethylmethacrylate (PMMA) or mixtures or copolymers thereof. In some embodiments, a polymer matrix comprises a polyolefin including, but not limited to polyethylene, polypropylene, polybutylene or mixtures or copolymers thereof.

In some embodiments, a polymeric matrix of a p-type layer comprises one or more conjugated polymers. In some embodiments, conjugated polymers comprise thiophenes including poly(3-hexylthiophene) (P3HT), poly(3-octylthiophene) (P3OT), and polythiophene (PTh).

In some embodiments, a polymeric matrix of a p-type layer comprises one or more semiconducting polymers. In some embodiments, semiconducting polymers include phenylene vinylenes, such as poly(phenylene vinylene) and poly(p-phenylene vinylene) (PPV), and derivatives thereof. In some embodiments, semiconducting polymers can comprise poly fluorenes, naphthalenes, and derivatives thereof. In some embodiments, semiconducting polymers comprise poly(2-vinylpyridine) (P2VP), polyamides, poly(N-vinylcarbazole) (PVCZ), polypyrrole (PPy), and polyaniline (PAn). In some embodiments, a semiconducting polymer comprises poly[2,6-(4,4-bis-(2-ethylhexyl)-4H-cyclopenta [2,1-b;3,4-b']dithiophene)-alt-4,7-(2,1,3-benzothiadiazole)] (PCPDTBT).

In some embodiments, a p-type layer can have any desired thickness not inconsistent with the objectives of the present invention. In some embodiments, a p-type layer has a thickness of at least about 10 nm or at least about 100 nm. A p-type layer, in some embodiments, has a thickness of at least about 500 nm or at least about 1 µm. In some embodiments a p-type layer has a thickness of at least about 5 µm or at least about 15 µm. In some embodiments, a p-type layer has a thickness ranging from about 5 nm to about 50 µm. In some embodiments, a p-type layer has a thickness ranging from about 50 nm to about 30 µm. In some embodiments, a p-type layer has a thickness ranging from about 100 nm to about 20 µm. In some embodiments, a p-type layer has a thickness ranging from about 10 nm to about 100 nm.

In some embodiments, a p-type layer can have any desired length not inconsistent with the objectives of the present invention. In some embodiments, a p-type layer has a length of at least about 1 µm or at least about 10 µm. In some embodiments, a p-type layer has a length of at least about 100 µm or at least about 500 µm. A p-type layer, in some embodiments, has a length of at least about 1 mm or at least about 10 mm. In some embodiments, a p-type layer has a length ranging from about 1 µm to about 100 mm. In some embodiments, a p-type layer has a length ranging from about 10 µm to about 500 mm.

A p-type layer, in some embodiments, has a Seebeck coefficient of at least about 5 µV/K at a temperature of 290 K. In some embodiments, a p-type layer has a Seebeck coefficient of at least about 10 µV/K at a temperature of 290 K. In some embodiments, a p-type layer has a Seebeck coefficient of at least about 15 µV/K or at least about 20 µV/K at a temperature of 290 K. In some embodiments, a p-type layer has a Seebeck coefficient of at least about 30 µV/K at a temperature of 290 K. A p-type layer, in some embodiments, has a Seebeck coefficient ranging from about 5 µV/K to about 35 µV/K at a temperature of 290 K. In some embodiments, a p-type layer has Seebeck coefficient ranging from about 10 µV/K to about 30 µV/K at a temperature of 290 K.

As described herein, in some embodiments, the Seebeck coefficient of a p-type layer can be varied according to carbon nanoparticle identity and loading. In some embodiments, for example, the Seebeck coefficient of a p-type layer is inversely proportional to the single-walled carbon nanotube loading of the p-type layer.

In addition to at least one p-type layer, a thermoelectric apparatus described herein comprises at least one n-type layer comprising a plurality of n-doped carbon nanoparticles.

N-doped carbon nanoparticles, in some embodiments, comprise fullerenes, carbon nanotubes, or mixtures thereof. Fullerenes, in some embodiments, comprise 1-(3-methoxycarbonyl)propyl-1-phenyl(6,6)$C_{61}$ (PCBM). In some embodiments, n-doped carbon nanotubes comprise single-walled carbon nanotubes, multi-walled carbon nanotubes or mixtures thereof.

In some embodiments, carbon nanoparticles of a n-type layer, including carbon nanotubes, are provided in a mat configuration.

In some embodiments, n-doped single-walled carbon nanotubes and/or n-doped multi-walled carbon nanotubes comprise nitrogen in an amount ranging from about 0.1 weight percent to about 30 weight percent. In some embodiments, n-doped single-walled carbon nanotubes and/or n-doped multi-walled carbon nanotubes comprise nitrogen in an amount ranging from about 5 weight percent to about 25 weight percent or from about 10 weight percent to about 20 weight percent. In some embodiments, n-doped single-walled carbon nanotubes and/or n-doped multi-walled carbon nanotubes comprise nitrogen in an amount less than about 0.1 weight percent. In some embodiments, n-doped single-walled carbon nanotubes and/or n-doped multi-walled carbon nanotubes are deoxygenated nanotubes.

In some embodiments, an n-type dopant is incorporated in the lattice of single-walled and/or multi-walled carbon nanotubes. In some embodiments, an n-type dopant is externally provided to carbon nanotubes by the environment surrounding the single walled and/or multi-walled carbon nanotubes. As described further herein, carbon nanotubes of an n-type layer, in some embodiments, are disposed in a polymeric matrix. In some embodiments, the polymeric matrix can provide n-dopant to surfaces of the carbon nanotubes. In some embodiments wherein the polymeric matrix provides n-dopant to surfaces of the carbon nanotubes, the carbon nanotubes are not n-doped prior to incorporation into the matrix. In some embodiments wherein the polymeric matrix provides n-dopant to surfaces of the carbon nanotubes, the carbon nanotubes are n-doped prior to incorporation into the matrix.

In some embodiments, n-doped carbon nanoparticles of an n-type layer have a high aspect ratio. In some embodiments, n-doped carbon nanoparticles of an n-type layer demonstrate an aspect ratio ranging from about 1 to about $10^6$. In some embodiments, n-doped carbon nanoparticles display an aspect ratio ranging from about 10 to about 100,000. In some embodiments, n-doped carbon nanoparticles have an aspect ratio ranging from about 10 to about 10,000 or from about 5 to about 1000.

Carbon nanoparticles of an n-type layer, including carbon nanotubes, in some embodiments, have a length ranging from about 1 nm to about 5 mm or from about 10 nm to about 1 mm. In some embodiments, n-doped carbon nanoparticles have a length ranging from about 50 nm to about 500 µm, from about 100 nm to about 100 µm, or from about 500 nm to 10 µm. In some embodiments, n-doped carbon nanotubes have a length ranging from about 200 µm to about 500 µm.

Carbon nanoparticles of an n-type layer, in some embodiments, have a diameter ranging from about 1 nm to about 100 nm. In some embodiments, n-doped carbon nanoparticles have a diameter ranging from about 10 nm to about 80 nm or from about 20 nm to about 60 nm. In some embodiments, n-doped carbon nanoparticles have a diameter greater than about 100 nm or less than about 1 nm.

An n-type layer, in some embodiments, can comprise one or more species of n-doped carbon nanoparticles described herein in an amount ranging from about 0.1 weight percent to about 100 weight percent, based on the total weight of the n-type layer. In some embodiments, an n-type layer comprises n-doped carbon nanoparticles in an amount of at least about 2 weight percent. In some embodiments, an n-type layer comprises n-doped carbon nanoparticles in an amount of at least about 5 weight percent or at least about 10 weight percent. In some embodiments, an n-type layer comprises n-doped carbon nanoparticles in an amount ranging from about 2 weight percent to about 50 weight percent. In some embodiments, an n-type layer comprises n-doped carbon nanoparticles in an amount ranging from about 5 weight percent to about 30 weight percent. As with the p-type layer, nanoparticle loadings of an n-type layer, in some embodiments, can be determined with reference to the desired Seebeck coefficient of the layer.

As described herein, an n-type layer further comprises a polymeric matrix in which the n-doped carbon nanoparticles are disposed. A polymeric matrix of an n-type layer can comprise any polymeric species recited herein for a p-type layer. For example, a polymeric matrix of an n-type layer can comprise semicrystalline polymer including, but not limited to, polyvinyl fluoride (PVF), polyvinylidene fluoride (PVDF), polyvinylidene fluoride-trifluoroethylene (PVDF-TrFE), polyvinylidene fluoride-tetrafluoroethylene (PVDF-TFE), polytetrafluoroethylene (PTFE), or mixtures or copolymers thereof. Semicrystalline polymers of PVDF, PVDF-TFE and/or PVDF-TrFE used in n-type layers of the thermoelectric apparatus can demonstrate increased amounts of β-phase. For example, PVDF, PVDF-TFE and/or PVDF-TrFE of a n-type layer can display a ratio of β/α of 1.5 to 2.5. In some embodiments, the β/α ratio is 2 to 2.5. As discussed herein, β-phase crystallites can be provided a non-random orientation by poling techniques, thereby enhancing piezoelectric and pyroelectric properties of the matrix.

In some embodiments, an n-type layer can have any desired thickness not inconsistent with the objectives of the present invention. In some embodiments, an n-type layer has a thickness of at least about 1 nm. In some embodiments, an n-type layer has a thickness of at least about 10 nm or at least about 100 nm. An n-type layer, in some embodiments, has a thickness of at least about 500 nm or at least about 1 µm. In some embodiments an n-type layer has a thickness of at least about 5 µm or at least about 15 µm. In some embodiments, an n-type layer has a thickness ranging from about 5 nm to about 50 µm. In some embodiments, an n-type layer has a thickness ranging from about 50 nm to about 30 µm. In some embodiments, an n-type layer has a thickness ranging from about 100 nm to about 20 µm.

In some embodiments, an n-type layer can have any desired length not inconsistent with the objectives of the present invention. In some embodiments, an n-type layer has a length of at least about 1 µm or at least about 10 µm. In some embodiments, an n-type layer has a length of at least about 100 µm or at least about 500 µm. An n-type layer, in some embodiments, has a length of at least about 1 mm or at least about 10 mm. In some embodiments, an n-type layer has a length ranging from about 1 µm to about 100 mm. In some embodiments, an n-type layer has a length ranging from about 10 µm to about 500 mm. In some embodiments, an n-type layer has a length coextensive or substantially coextensive with an adjacent p-type layer.

An n-type layer, in some embodiments, has a Seebeck coefficient of at least about −5 µV/K at a temperature of 290 K. In some embodiments, an n-type layer has a Seebeck coefficient at least about −10 µV/K at a temperature of 290 K. In some embodiments, an n-type layer has a Seebeck coefficient of at least about −15 µV/K or at least about −20 µV/K at a temperature of 290 K. In some embodiments, an n-type layer has a Seebeck coefficient of at least about −30 µV/K at a temperature of 290 K. An n-type layer, in some embodiments, has a Seebeck coefficient ranging from about −5 µV/K to about −35 µV/K at a temperature of 290 K. In some embodiments, an n-type layer has Seebeck coefficient ranging from about −10 µV/K to about −30 µV/K at a temperature of 290 K.

In some embodiments, the Seebeck coefficient of an n-type layer can be varied according to n-doped carbon nanoparticle identity and loading. In some embodiments, for example, the Seebeck coefficient of an n-type layer is inversely proportional to the carbon nanoparticle loading of the n-type layer.

In some embodiments of a thermoelectric apparatus described herein, carbon nanoparticles including p-doped and n-doped carbon nanotubes can be substituted with one or more inorganic semiconductor nanoparticles. In some embodiments, inorganic semiconductor nanoparticles comprise group IV materials, group II/VI materials or group III/V materials or combinations thereof. In some embodiments, inorganic semiconductor nanoparticles comprise quantum dots and/or nanowires. In some embodiments, inorganic semiconductor materials are provided with p-dopant or n-dopant for use in respective p-layers and n-layers described herein.

A thermoelectric apparatus described herein, in some embodiments, also comprises an insulating layer disposed between the at least one p-type layer and the at least one n-type layer. In some embodiments, an insulating layer is electrically insulating. In some embodiments, the insulating layer is electrically insulating and thermally insulating. In some embodiments, a thermoelectric apparatus comprises a plurality of insulating layers disposed between a plurality of p-type layers and n-type layers. Insulating layers, in some embodiments, permit p-type layers and n-type layers of a thermoelectric apparatus described herein to be arranged in a stacked configuration.

In some embodiments, an insulating layer comprises one or more polymeric materials. Any polymeric material not inconsistent with the objectives of the present invention can be used in the production of an insulating layer. A polymeric insulating layer can comprise semicrystalline polymer including, but not limited to, polyvinyl fluoride (PVF), polyvinylidene fluoride (PVDF), polyvinylidene fluoride-trifluoroethylene (PVDF-TrFE), polyvinylidene fluoride-tetrafluoroethylene (PVDF-TFE), polytetrafluoroethylene (PTFE), or mixtures or copolymers thereof. Semicrystalline polymers of PVDF, PVDF-TFE and/or PVDF-TrFE used in insulating layers of the thermoelectric apparatus can demonstrate increased amounts of β-phase. For example, PVDF, PVDF-TFE and/or PVDF-TrFE of an insulating layer can display a ratio of β/α of 1.5 to 2.5. In some embodiments, the β/α ratio is 2 to 2.5. As discussed herein, β-phase crystallites can be provided a non-random orientation by poling techniques, thereby enhancing piezoelectric and pyroelectric properties of the insulating layer.

An insulating layer, in some embodiments, comprises polyacrylic acid (PAA), polymethacrylate (PMA), polymethylmethacrylate (PMMA) or mixtures or copolymers thereof. In some embodiments, an insulating layer comprises a polyolefin including, but not limited to polyethylene, polypropylene, polybutylene or mixtures or copolymers thereof.

A polymeric insulating layer can further comprise particles demonstrating piezoelectric behavior. For example, a polymeric insulating layer can comprise particles of $BaTiO_3$, BiTe particles, other inorganic piezoelectric particles or mixtures thereof. The $BaTiO_3$ particles, BiTe particles and/or other inorganic particles can have any size and/or geometry not inconsistent with the objectives of the present invention. $BaTiO_3$ and BiTe particles can demonstrate a size distribution ranging from 20 nm to 500 nm. Further, piezoelectric particles can be dispersed in polymer of the insulation layer at any loading not inconsistent with the objectives of the present invention. In some embodiments, $BaTiO_3$ particles, BiTe particles and/or other inorganic piezoelectric particles are nanoparticles are present in an insulating layer in an amount of 5-80 weight percent or 10-50 weight percent, based on the total weight of the insulating layer. As described herein, piezoelectric particles of an insulating layer can be electrically poled to further enhance the piezoelectric and/or pyroelectric properties of thermoelectric apparatus described herein.

Alternatively, an insulating layer can be formed of an inorganic or ceramic material. In some embodiments, an insulating layer is formed of metal oxide particles, including transition metal oxide particles. Suitable metal oxide particles can also demonstrate piezoelectric behavior. In one embodiment, for example, an insulating layer is formed of $BaTiO_3$ particles that can be electrically poled.

An insulating layer can have any desired thickness not inconsistent with the objectives of the present invention. In some embodiments, an insulating layer has a thickness of at least about 50 nm. In some embodiments, an insulating layer has a thickness of at least about 75 nm or at least about 100 nm. An insulating layer, in some embodiments, has a thickness of at least about 500 nm or at least about 1 μm. In some embodiments, an insulating layer has a thickness of at least about 5 μm or at least about 15 μm. In some embodiments, an insulating layer has a thickness ranging from about 5 nm to about 50 μm. In some embodiments, an insulating layer has a thickness ranging from about 50 nm to about 30 μm. In some embodiments, an insulating layer has a thickness ranging from about 100 nm to about 20 μm.

An insulating layer can have any desired length not inconsistent with the objectives of the present invention. In some embodiments, an insulating layer has a length substantially consistent with the lengths of the p-type and n-type layers between which the insulating layer is disposed. In some embodiments, an insulating layer has a length of at least about 1 μm or at least about 10 μm. In some embodiments, an insulating layer has a length of at least about 100 μm or at least about 500 μm. An insulating layer, in some embodiments, has a length of at least about 1 mm or at least about 10 μm. In some embodiments, an insulating layer has a length ranging from about 1 μm to about 100 μm. In some embodiments, an insulating layer has a length ranging from about 10 μm to about 500 mm.

A thermoelectric apparatus described herein, in some embodiments, comprises a plurality of p-type layers and a plurality of n-type layers. In some embodiments, a thermoelectric apparatus can comprise any number of p-type layers and n-type layers not inconsistent with the objectives of the present invention. In some embodiments, the p-type layers and the n-type layers are ordered in alternating fashion and in a stacked configuration, being separated by insulating layers. In some embodiments, a thermoelectric apparatus comprises at least 3 p-type layers and at least 3 n-type layers. In some embodiments, a thermoelectric apparatus comprises at least 5 p-type layers and at least 5 n-type layers. In some embodiments, a thermoelectric apparatus comprises at least 10 p-type layers and at least 10 n-type layers. In some embodiments, a thermoelectric apparatus comprises at least 15 p-type layers and at least 15 n-type layers. In some embodiments, a thermoelectric apparatus comprises at least 100 p-type layers and at least 100 n-type layers. In some embodiments, a thermoelectric apparatus comprises at least 1000 p-type layers and at least 1000 n-type layers.

In some embodiments, a thermoelectric apparatus described herein comprising one or more p-type layers and one or more n-type layers has the form of a fabric. In some embodiments, the fabric is flexible permitting application of the thermoelectric apparatus to a variety of substrates having different surface shapes and/or morphologies. In some embodiments, for example, a thermoelectric apparatus is applied to curved and/or other non-planar substrates.

In some embodiments, a thermoelectric apparatus having a construction described herein has a Seebeck coefficient of at least about 25 μV/K at a temperature of 290 K. In some embodiments, a thermoelectric apparatus described herein has a Seebeck coefficient of at least about 30 μV/K or at least about 50 μV/K at a temperature of 290 K. In some embodiments, a thermoelectric apparatus described herein has a Seebeck coefficient of at least about 75 μV/K or at least about 100 μV/K at a temperature of 290 K. A thermoelectric apparatus described herein, in some embodiments, has a Seebeck coefficient of at least about 150 μV/K or at least about 175 μV/K at a temperature of 290 K. In some embodiments, a thermoelectric apparatus described herein has a Seebeck coefficient of at least about 200 μV/K at a temperature of 290 K. In some embodiments, a thermoelectric apparatus described herein has a Seebeck coefficient ranging from about 25 μV/K to about 250 μV/K at a temperature of 290 K. In some embodiments, a thermoelectric apparatus described herein has a Seebeck coefficient ranging from about 50 μV/K to about 150 μV/K at a temperature of 290 K.

In some embodiments, a thermoelectric apparatus described herein has a ZT of at least 0.5. A thermoelectric apparatus described herein, in some embodiments, has a ZT of at least about 0.7 or at least about 0.8. In some embodiments, a thermoelectric apparatus described herein has a ZT of at least about 1 or at least about 1.5. In some embodiments, a thermoelectric apparatus described herein has a ZT ranging from about 0.5 to about 2 or from about 0.8 to about 1.5. In some embodiments, a thermoelectric apparatus described herein has a ZT ranging from about 1 to about 1.3. In some embodiments, a thermoelectric apparatus described herein has a ZT ranging from about 1 to 10.

II. Photo-Thermal Apparatus

In another aspect, a photo-thermal apparatus is described herein comprising a photovoltaic component and a thermoelectric component. The thermoelectric component can comprise any thermoelectric apparatus described hereinabove in Section I. For example, in some embodiments, the thermoelectric component comprises at least one p-type layer coupled to at least one n-type layer to provide a pn junction, and an insulating layer at least partially disposed between the p-type layer and the n-type layer, the p-type layer comprising a plurality of carbon nanoparticles and the n-type layer comprising a plurality of n-doped carbon nanoparticles. In some embodiments, p-type layer(s), n-type layer(s) and/or insulating layer(s) of the thermoelectric component comprise an electrically poled polymer. In some embodiments, the pn junction comprises a metallic interlayer disposed between the p-type layer and the n-type layer that form the junction. Further, in some embodiments, the thermoelectric component comprises a plurality of p-type layers coupled to a plurality of n-type layers providing a plurality of pn junctions, and insulating layers at least partially disposed between the p-type layers and the n-type layers.

Figure 4:
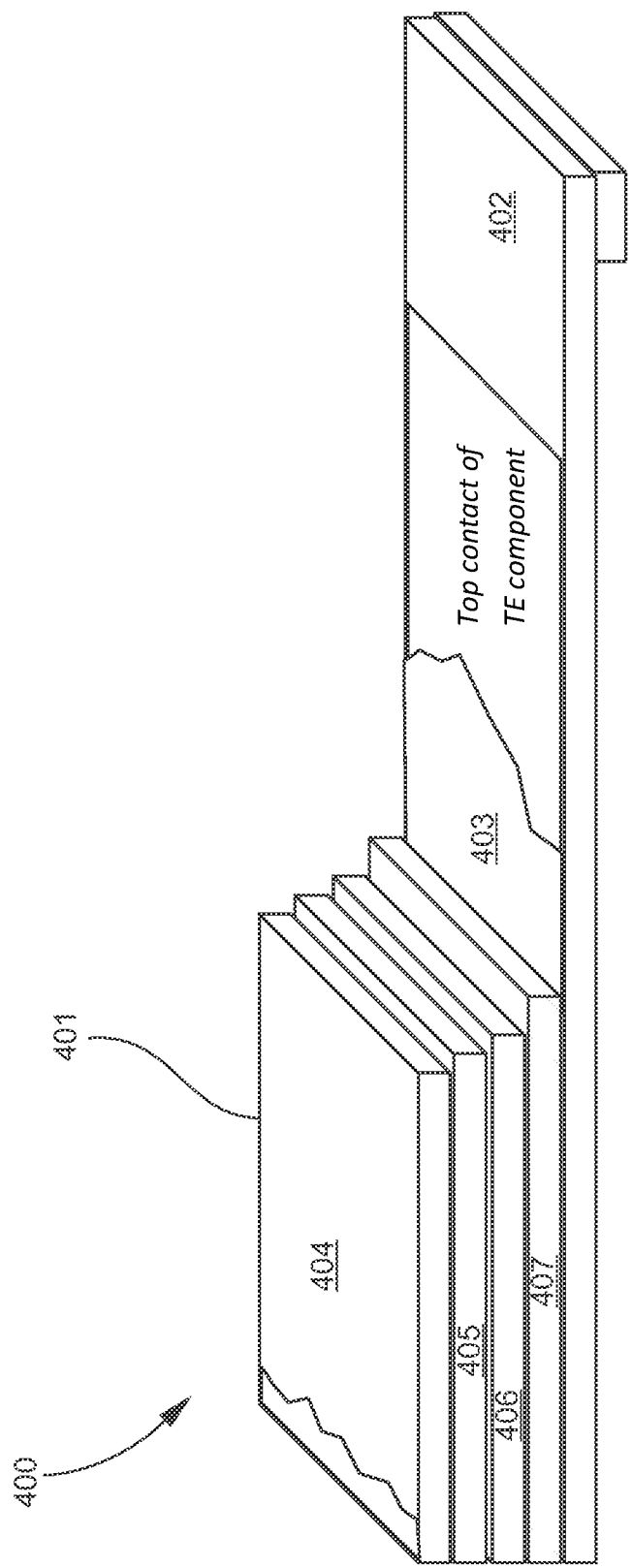
FIG. 4 illustrates a photo-thermal apparatus according to one embodiment described herein.

FIG. 4 illustrates a photo-thermal apparatus according to one embodiment described herein. The photo-thermal apparatus (400) illustrated in FIG. 4 comprises a photovoltaic component (401) coupled to a thermoelectric component (402). The thermoelectric component can comprise any construction described herein for a thermoelectric apparatus.

Moreover, the photovoltaic component comprises a radiation transmissive first electrode (404), at least one photosensitive layer (405), an exciton blocking layer (406) and a second radiation transmissive electrode (407). In some embodiments of a photo thermal apparatus, an electrode of the photovoltaic component adjacent to the thermoelectric component is non-radiation transmissive.

Radiation transmissive first electrode and second electrode, according to some embodiments described herein, comprise a radiation transmissive conducting oxide.

Radiation transmissive conducting oxides, in some embodiments, can comprise indium tin oxide (ITO), gallium indium tin oxide (GITO), and zinc indium tin oxide (ZITO). In some embodiments, radiation transmissive first and second electrodes can comprise a radiation transmissive polymeric material such as polyanaline (PANI) and its chemical relatives. In some embodiments, radiation transmissive first and second electrodes comprise ZnO:Al.

In some embodiments, 3,4-polyethylenedioxythiophene (PEDOT) can be a suitable radiation transmissive polymeric material for the first and/or second electrode. In some embodiments, a radiation transmissive first and/or second electrode can comprise a carbon nanotube layer having a thickness operable to at least partially pass visible electromagnetic radiation.

In another embodiment, a radiation transmissive first and/or second electrode can comprise a composite material, the composite material comprising a nanoparticle phase dispersed in a polymeric phase. The nanoparticle phase, in one embodiment, can comprise carbon nanotubes, fullerenes, or mixtures thereof. In a further embodiment, a radiation transmissive first and/or second electrode can comprise a metal layer having a thickness operable to at least partially pass visible electromagnetic radiation. In some embodiments, a metal layer can comprise elementally pure metals or alloys. Metals suitable for use as a radiation transmissive first electrode can comprise high work function metals.

In some embodiments, radiation transmissive first and second electrodes can have a thickness ranging from about 10 nm to about 1 µm. In some embodiments, radiation transmissive first and second electrodes can have a thickness ranging from about 100 nm to about 900 nm. In another embodiment, radiation transmissive first and second electrodes can have a thickness ranging from about 200 nm to about 800 nm. In a further embodiment, radiation transmissive first and second electrodes can have a thickness greater than about 1 µm.

In some embodiments, radiation transmissive first and second electrodes are constructed independently of one another. In some embodiments, radiation transmissive first and second electrodes are constructed with reference to one another.

In some embodiments, the at least one photosensitive layer of a photovoltaic component comprises an organic composition. In some embodiments, a photosensitive organic layer has a thickness ranging from about 30 nm to about 1 µm. In other embodiments, a photosensitive organic layer has a thickness ranging from about 80 nm to about 800 nm. In a further embodiment, a photosensitive organic layer has a thickness ranging from about 100 nm to about 300 nm.

A photosensitive organic layer, according to embodiments described herein, comprises at least one photoactive region in which electromagnetic radiation is absorbed to produce excitons which may subsequently dissociate into electrons and holes. In some embodiments, a photoactive region can comprise a polymer. Polymers suitable for use in a photoactive region of a photosensitive organic layer, in one embodiment, can comprise conjugated polymers such as thiophenes including poly(3-hexylthiophene) (P3HT), poly (3-octylthiophene) (P3OT), and polythiophene (PTh).

In some embodiments, polymers suitable for use in a photoactive region of a photosensitive organic layer can comprise semiconducting polymers. In one embodiment, semiconducting polymers include phenylene vinylenes, such as poly(phenylene vinylene) and poly(p-phenylene vinylene) (PPV), and derivatives thereof. In other embodiments, semiconducting polymers can comprise poly fluorenes, naphthalenes, and derivatives thereof. In a further embodiment, semiconducting polymers for use in a photoactive region of a photosensitive organic layer can comprise poly(2-vinylpyridine) (P2VP), polyamides, poly(N-vinylcarbazole) (PVCZ), polypyrrole (PPy), and polyaniline (PAn).

A photoactive region, according to some embodiments, can comprise small molecules. In one embodiment, small molecules suitable for use in a photoactive region of a photosensitive organic layer can comprise coumarin 6, coumarin 30, coumarin 102, coumarin 110, coumarin 153, and coumarin 480 D. In another embodiment, a small molecule can comprise merocyanine 540. In a further embodiment, small molecules can comprise 9,10-dihydrobenzo[a]pyrene-7(8H)-one, 7-methylbenzo[a]pyrene, pyrene, benzo[e]pyrene, 3,4-dihydroxy-3-cyclobutene-1,2-dione, and 1,3-bis [4-(dimethylamino)phenyl-2,4-dihydroxycyclobutenediylium dihydroxide.

In some embodiments, exciton dissociation is precipitated at heterojunctions in the organic layer formed between adjacent donor and acceptor materials. Organic layers, in some embodiments described herein, comprise at least one bulk heterojunction formed between donor and acceptor materials. In other embodiments, organic layers comprise a plurality of bulk heterojunctions formed between donor and acceptor materials.

In the context of organic materials, the terms donor and acceptor refer to the relative positions of the highest occupied molecular orbital (HOMO) and lowest unoccupied molecular orbital (LUMO) energy levels of two contacting but different organic materials. This is in contrast to the use of these terms in the inorganic context, where donor and acceptor may refer to types of dopants that may be used to create inorganic n- and p-type layers, respectively. In the organic context, if the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

A photoactive region in a photosensitive organic layer, according to some embodiments described herein, comprises a polymeric composite material. The polymeric composite material, in one embodiment, can comprise a nanoparticle phase dispersed in a polymeric phase. Polymers suitable for producing the polymeric phase of a photoactive region can comprise conjugated polymers such as thiophenes including poly(3-hexylthiophene) (P3HT) and poly(3-octylthiophene) (P3OT).

In some embodiments, the nanoparticle phase dispersed in the polymeric phase of a polymeric composite material comprises at least one carbon nanoparticle. Carbon nanoparticles can comprise fullerenes, carbon nanotubes, or mixtures thereof. Fullerenes suitable for use in the nanoparticle phase, in one embodiment, can comprise 1-(3-methoxycarbonyl)propyl-1-phenyl(6,6)$C_{61}$ (PCBM). Carbon nanotubes for use in the nanoparticle phase, according to some embodiments, can comprise single-walled nanotubes, multi-walled nanotubes, or mixtures thereof.

In some embodiments described herein, the polymer to nanoparticle ratio in polymeric composite materials ranges from about 1:10 to about 1:0.1. In some embodiments, the polymer to nanoparticle ratio in polymeric composite materials ranges from about 1:4 to about 1:0.4. In some embodiments, the polymer to nanoparticle ratio in polymeric composite materials ranges from about 1:2 to about 1:0.6. In one embodiment, for example, the ratio of poly(3-hexylthiophene) to PCBM ranges from about 1:1 to about 1:0.4.

In a further embodiment, the nanoparticle phase dispersed in the polymeric phase comprises at least one nanowhisker. A nanowhisker, as used herein, refers to a crystalline carbon nanoparticle formed from a plurality of carbon nanoparticles. Nanowhiskers, in some embodiments, can be produced by annealing a photosensitive organic layer comprising the polymeric composite material. Carbon nanoparticles operable to form nanowhiskers, according to some embodiments, can comprise single-walled carbon nanotubes, multi-walled carbon nanotubes, and fullerenes. In one embodiment, nanowhiskers comprise crystalline PCBM. Annealing the photosensitive organic layer, in some embodiments, can further increase the dispersion of the nanoparticle phase in the polymeric phase.

In embodiments of photoactive regions comprising a polymeric phase and a nanoparticle phase, the polymeric phase serves as a donor material and the nanoparticle phase serves as the acceptor material thereby forming a heterojunction for the separation of excitons into holes and electrons. In embodiments wherein nanoparticles are dispersed throughout the polymeric phase, the photoactive region of the organic layer comprises a plurality of bulk heterojunctions. In some embodiments, donor materials in a photoactive region of a photosensitive organic layer can comprise organometallic compounds including porphyrins, phthalocyanines, and derivatives thereof. In further embodiments, acceptor materials in a photoactive region of a photosensitive organic layer can comprise perylenes, naphthalenes, and mixtures thereof.

In some embodiments, the at least one photosensitive layer of a photovoltaic component comprises an inorganic composition. Photosensitive inorganic layers described herein, in some embodiments, can have various compositions. In some embodiments, a photosensitive inorganic layer of a photovoltaic component described herein comprises an inorganic composition comprising a group IV semiconductor material, a group II/VI semiconductor material (such as CdTe), a group III/V semiconductor material, or combinations or mixtures thereof. In some embodiments, a photosensitive inorganic layer comprises a group IV, group II/VI, or group III/V binary, ternary or quaternary system. In some embodiments, a photosensitive inorganic layer comprises a I/III/VI material, such as copper indium gallium selenide (CIGS). In some embodiments, a photosensitive inorganic layer comprises polycrystalline silicon (Si). In some embodiments, a photosensitive inorganic layer comprises microcrystalline, nanocrystalline, and/or protocrystalline silicon. In some embodiments, a photosensitive inorganic layer comprises polycrystalline copper zinc tin sulfide (CZTS). In some embodiments, a photosensitive inorganic layer comprises microcrystalline, nanocrystalline, and/or protocrystalline CZTS. In some embodiments, the CZTS comprises $Cu_2ZnSnS_4$. In some embodiments, the CZTS further comprises selenium (Se). In some embodiments, the CZTS further comprises gallium (Ga).

In some embodiments, a photosensitive inorganic layer of a photovoltaic component described herein comprises an amorphous material. In some embodiments, at least one photosensitive inorganic layer comprises amorphous silicon (a-Si). In some embodiments, amorphous silicon of a photosensitive inorganic layer is unpassivated or substantially unpassivated. In some embodiments, amorphous silicon of a photosensitive inorganic layer is passivated with hydrogen (a-Si:H). In some embodiments, amorphous silicon of a photosensitive inorganic layer is not passivated with a halogen or is non-halogen passivated. In some embodiments, for example, amorphous silicon of a photosensitive inorganic layer comprises no or substantially no Si:F. Alternatively, in some embodiments, amorphous silicon of a photosensitive inorganic layer is fluorine passivated (a-Si:F).

In some embodiments, one or more heterojunctions can be established in a photosensitive inorganic layer described herein by doping. In some embodiments, for example, one region of a photosensitive inorganic layer is doped with a p-dopant and another region of the photosensitive inorganic layer is doped with an n-dopant to provide a heterojunction. In some embodiments wherein a material of the photosensitive inorganic layer is intrinsically p-type, a region of the photosensitive inorganic layer can be doped with an n-dopant to provide a heterojunction. In some embodiments, wherein a material of the photosensitive inorganic layer is intrinsically n-type, a region of the photosensitive inorganic layer can be doped with a p-dopant to provide a heterojunction.

In some embodiments, any of the inorganic materials described herein for a photosensitive layer suitable for doping are doped to establish one or more heterojunctions in the photosensitive layer. In some embodiments, for example, hydrogen passivated amorphous silicon is doped with p-type and/or n-type dopant to establish one or more heterojunctions. Moreover, in some embodiments, group IV, group III/V and/or group II/VI semiconductor materials of inorganic photosensitive layers described herein can be doped with p-type and/or n-type dopant to provide one or more heterojunctions.

In some embodiments, a photovoltaic component described herein comprises at least one photosensitive inorganic layer comprising an n-type region, an intrinsic region, and a p-type region. In some embodiments, an n-type region is composed of an n-doped inorganic semiconductor. In some embodiments, a p-type region is composed of a p-doped inorganic semiconductor. In some embodiments, an intrinsic region is composed of an undoped inorganic semiconductor.

In some embodiments, a photovoltaic component described herein comprises a multi-junction construction. In some embodiments, a photovoltaic component comprises a plurality of photosensitive inorganic layers, each layer comprising an n-type region, an intrinsic region, and a p-type region. In some embodiments, a photovoltaic component comprises two photosensitive inorganic layers, each layer comprising an n-type region, an intrinsic region, and a p-type region, thereby providing a double junction device. In some embodiments, a photovoltaic component comprises three photosensitive inorganic layers, each layer comprising an n-type region, an intrinsic region, and a p-type region, thereby providing a triple junction device. In some embodiments comprising a plurality of photosensitive inorganic layers each comprising an n-type region, an intrinsic region, and a p-type region, the plurality of inorganic layers are adjacent to one another, such that one or more heterojunctions are formed between the inorganic layers. In some embodiments, for example, a photovoltaic component comprises a first photosensitive inorganic layer comprising a first n-type region, a first intrinsic region, and a first p-type region; and a second photosensitive inorganic layer comprising a second n-type region, a second intrinsic region, and a second p-type region, wherein the first p-type region is adjacent to the second n-type region or the first n-type region is adjacent to the second p-type region. In some embodiments, an optoelectronic device described herein comprises a single junction device. As known to one of skill in the art, tunneling junctions, in some embodiments, can be disposed between first, second and/or third photosensitive inorganic layers in the construction of a multi-junction device described herein.

In some embodiments, a photovoltaic component comprises a plurality of photosensitive organic layers.

In some embodiments wherein a plurality of photosensitive layers is present in a photovoltaic component, the absorption profiles of the photosensitive layers do not overlap or do not substantially overlap. In some embodiments wherein a plurality of photosensitive layers is present in a photovoltaic component, the absorption profiles of the photosensitive layers at least partially overlap. In some embodiments, a plurality of photosensitive layers can be used in a photovoltaic component to capture one or more regions of the solar spectrum.

In some embodiments, an exciton blocking layer (EBL) of a photovoltaic component can act to confine photogenerated excitons to the region near the dissociating interface and prevent parasitic exciton quenching at a photosensitive layer/electrode interface. In addition to limiting the path over which excitons may diffuse, an EBL can additionally act as a diffusion barrier to substances introduced during deposition of the electrodes. In some embodiments, an EBL can have a sufficient thickness to fill pin holes or shorting defects which could otherwise render a photovoltaic apparatus inoperable.

An EBL, according to some embodiments described herein, can comprise a polymeric composite material. In one embodiment, an EBL comprises carbon nanoparticles dispersed in 3,4-polyethylenedioxythiophene:polystyrenesulfonate (PEDOT:PSS). In another embodiment, an EBL comprises carbon nanoparticles dispersed in poly(vinylidene chloride) and copolymers thereof. Carbon nanoparticles dispersed in the polymeric phases including PEDOT:PSS and poly(vinylidene chloride) can comprise single-walled nanotubes, multi-walled nanotubes, fullerenes, or mixtures thereof. In further embodiments, EBLs can comprise any polymer having a work function energy operable to permit the transport of holes while impeding the passage of electrons.

In some embodiments, an EBL may be disposed between the radiation transmissive first electrode and an organic photosensitive layer of a photoactive assembly. In some embodiments wherein the optoelectronic device comprises a plurality of photosensitive organic layers, for example, EBLs can be disposed between the photosensitive organic layers.

In some embodiments, a photovoltaic component comprises one or more upconverters and/or downconverters. As understood by one of skill in the art, an upconverter is a material operable to emit electromagnetic radiation having energy greater than that of the electromagnetic radiation absorbed by the material to create the excited state. Upconverters suitable for use in some embodiments, can absorb infrared radiation and emit visible radiation at wavelengths operable to be absorbed by photosensitive organic layers of photovoltaic components described herein.

Upconverters, in some embodiments, can include materials comprising at least one Lanthanide series element. In some embodiments, upconverter materials can comprise nanoparticles comprising at least one Lanthanide series element. Lanthanide series elements suitable for use in upconverter materials according to some embodiments described herein comprise erbium, ytterbium, dysprosium, holmium, or mixtures thereof. In some embodiments, upconverter materials comprise metal oxides and metal sulfides doped with ions of erbium, ytterbium, dysprosium, holmium, or mixtures thereof. In other embodiments, optical fibers may be doped directly with ions of erbium, ytterbium, dysprosium, holmium, or mixtures thereof.

In other embodiments, upconverter materials can comprise organic chemical species. Organic upconverter materials can comprise $H_2C_6N$ and 4-dialkylamino-1,8-naphthalimides as well as 1,8-naphthalimide derivatives and compounds, such as multibranched naphthalimide derivatives TPA-NA1, TPA-NA2, and TPA-NA3. Organic upconverter materials can also comprise 4-(dimethylamino)cinnamonitrile (cis and trans), trans-4-[4-(dimethylamino)styryl]-1-methylpyridinium iodide, 4-[4-(dimethylamino)styryl]pyridine, 4-(diethylamino)benzaldehyde diphenylhydrazone, trans-4-[4-(dimethylamino)styryl]-1-methylpyridinium p-toluenesulfonate, 2-[ethyl[4-[2-(4-nitrophenyl)ethenyl]phenyl]amino]ethanol, 4-dimethylamino-4'-nitrostilbene, Disperse Orange 25, Disperse Orange 3, and Disperse Red 1.

In a further embodiment, upconverter materials can comprise quantum dots. Quantum dots, according to some embodiments, can comprise III/V and II/VI semiconductor materials, such as cadmium selenide (CdSe), cadmium telluride (CdTe), and zinc selenide (ZnSe). Upconverter materials can also comprise core-shell architectures of quantum dots.

In addition to those provided herein, some embodiments described herein contemplate additional upconverter materials comprising transition metals, such as chromium.

In some embodiments, a photovoltaic component has a construction consistent with that described in United States Patent Application Publications 2009/0173372 and 2009/0301565, each of which is incorporated herein by reference in its entirety.

Referring once again to FIG. 4, the photo-thermal apparatus (400) further comprises a Stokes shift layer (403) disposed between the photovoltaic component (401) and the thermoelectric component (402). In some embodiments, the Stokes shift layer comprises one or more Stokes shift chemical species operable to create heat energy for transmission to the adjacent side of the thermoelectric component. In some embodiments, Stokes shift chemical species absorb electromagnetic radiation that has passed through the photovoltaic component (401). Moreover, in some embodiments, radiation emitted by one or more Stokes shift chemical species is absorbed by the photovoltaic component (401).

Any Stokes shift material not inconsistent with the objectives of the present invention can be used for incorporation into the Stokes shift layer. In some embodiments, suitable Stokes shift materials are selected according to absorption and emission profiles. In some embodiments, the absorption profile of a Stokes shift material does not overlap with the absorption profile of a photosensitive layer of the photovoltaic component. In some embodiments, the absorption profile of a Stokes shift material at least partially overlaps with the absorption profile of a photosensitive layer of the photovoltaic component. Additionally, in some embodiments, a Stokes shift material has an emission profile that at least partially overlaps with the absorption profile of a photosensitive layer of the photovoltaic component.

In some embodiments, a Stokes shift material is operable to absorb radiation in the near ultraviolet region of the electromagnetic spectrum. In some embodiments, for example, a Stokes shift material absorbs radiation having a wavelength ranging from about 300 nm to about 400 nm.

In some embodiments, a Stokes shift material comprises a dye. Any dye not inconsistent with the objectives of the present invention may be used. In some embodiments, for example, a dye comprises one or more of coumarins, coumarin derivatives, pyrenes, and pyrene derivatives. In some embodiments, a Stokes shift material comprises an ultraviolet light-excitable fluorophore. Non-limiting examples of dyes suitable for use in some embodiments described herein include methoxycoumarin, dansyl dyes, pyrene, Alexa Fluor 350, aminomethylcoumarin acetate (AMCA), Marina Blue dye, Dapoxyl dyes, dialkylaminocoumarin, bimane dyes, hydroxycoumarin, Cascade Blue dye, Pacific Orange dye, Alexa Fluor 405, Cascade Yellow dye, Pacific Blue dye, PyMPO, and Alexa Fluor 430.

In some embodiments, a Stokes shift material comprises a phosphor. Any phosphor not inconsistent with the objectives of the present invention may be used. In some embodiments, for example, a phosphor comprises one or more of halophosphate phosphors and triphosphors. Non-limiting examples of phosphors suitable for use in some embodiments described herein include $Ca_5(PO_4)_3(F, Cl):Sb^{3+}, Mn^{2+}$; $Eu:Y_2O_3$; and $Tb^{3+}, Ce^{3+}:LaPO_4$. In some embodiments, a phosphor comprises a phosphor particle. Phosphor particles, in some embodiments, can be suspended in a fluid.

III. Methods of Making a Thermoelectric Apparatus

In another aspect, methods of making a thermoelectric apparatus are described herein. In some embodiments, a method of making a thermoelectric apparatus comprises providing at least one p-type layer comprising a plurality of carbon nanoparticles, providing at least one n-type layer comprising a plurality of n-doped carbon nanoparticles, positioning an insulating layer between the p-type layer and the n-type layer, and coupling the p-type layer and the n-type layer to provide a pn junction. In some embodiments, carbon nanoparticles of the p-type layer are disposed in a first polymeric matrix and carbon nanoparticles of the n-type layer are disposed in a second polymeric matrix, wherein the first polymeric matrix and/or second polymeric matrix is electrically poled. Poling can be carried out in any manner not inconsistent with the objectives of the present invention. In some embodiments, for instance, poling comprises press fitting one or more interdigitated arrays along the length of the p-type layer and/or n-type layer and applying a poling voltage to the arrays. Insulating layer(s) of the thermoelectric apparatus, in some embodiments, comprise electrically poled polymer or electrically poled particles demonstrating piezoelectric behavior.

Moreover, in some embodiments, a method of making a thermoelectric apparatus described herein further comprises disposing a metallic interlayer between the p-type layer and the n-type layer that provide the junction. The metallic interlayer can have any construction described herein.

Further, in some embodiments, a plurality of p-type layers and n-type layers are provided and coupled to one another resulting in the formation of a plurality of pn junctions. In some embodiments insulating layers are positioned between the p-type layers and the n-type layers. Additionally, in some embodiments of methods of making a thermoelectric apparatus, the p-type layers and the n-type layers are arranged in a stacked configuration. The p-layers and the p-layers can be coupled by metal contacts to provide the pn junctions. In some embodiments, for example, a p-layer is coupled to an n-layer by a metal contact to provide a pn junction of a thermoelectric apparatus described herein.

IV. Methods of Making a Photo-Thermal Apparatus

In another aspect, methods of making a photo-thermal apparatus are described herein. In some embodiments, a method of making a photo-thermal apparatus comprises providing a photovoltaic component, providing a thermoelectric component and coupling the photovoltaic component and the thermoelectric component. The thermoelectric component can have the structure of any thermoelectric apparatus described herein. For example, in some embodiments, the thermoelectric component comprises at least one p-type layer coupled to at least one n-type layer to provide a pn junction, and an insulating layer at least partially disposed between the p-type layer and the n-type layer, the p-type layer comprising a plurality of carbon nanoparticles and the n-type layer comprising a plurality of n-doped carbon nanoparticles. Additionally, p-type layer(s), n-type layer(s) and/or insulating layer(s) can comprise electrically poled polymer. In some embodiments, the pn junction comprises a metallic interlayer disposed between the p-type layer and the n-type layer that form the junction. Further, in some embodiments, the thermoelectric component comprises a plurality of p-type layers coupled to a plurality of n-type layers to provide a plurality of pn junctions as described herein.

In some embodiments, a method of making a photo-thermal apparatus further comprises disposing a Stokes shift layer between the photovoltaic component and the thermoelectric component.

V. Methods of Converting Electromagnetic Energy

In another aspect, methods of converting electromagnetic energy into electrical energy are described herein. In some embodiments, a method of converting electromagnetic energy into electrical energy comprises providing an apparatus described hereinabove in Section II, such as an apparatus comprising a photovoltaic component and a thermoelectric component coupled to the photovoltaic component, the thermoelectric component comprising at least one p-type layer coupled to at least one n-type layer to provide a pn junction, and an insulating layer at least partially disposed between the p-type layer and the n-type layer, the p-type layer comprising a plurality of carbon nanoparticles and the n-type layer comprising a plurality of n-doped carbon nanoparticles. Electromagnetic radiation is absorbed by the photovoltaic component to provide a photocurrent and to heat one side of the thermoelectric component inducing a voltage across the thermoelectric component. Additionally, in some embodiments, nanoparticles of the at least one p-type layer and/or nanoparticles of the at least one n-type layer of the thermoelectric component are disposed in an electrically poled polymeric matrix. Insulating layer(s) of the thermoelectric component, in some embodiments, comprise electrically poled polymer or electrically poled particles demonstrating piezoelectric behavior.

In some embodiments, heating one side of the thermoelectric component comprises transferring heat generated in the photovoltaic component to one side of the thermoelectric component. Additionally, in some embodiments, heating one side of the thermoelectric component comprises providing a Stokes shift layer between the photovoltaic component and the thermoelectric component, absorbing electromagnetic radiation with the Stokes shift layer to generate heat and electromagnetic radiation and transferring the generated heat to one side of the thermoelectric component. In some embodiments, the electromagnetic radiation generated by the Stokes shift layer is transmitted to the photovoltaic component for the generation of photocurrent.

VI. Thermoelectric Articles and Fabrics

In another aspect, thermoelectric articles are described herein. In still another aspect, thermoelectric fabrics are described herein. In some embodiments, articles and/or fabrics described herein can be used to efficiently convert thermal energy into electrical energy, including when the articles and/or fabrics are disposed on non-planar or complex surfaces. For example, in some embodiments, an article or fabric described herein can be used as or incorporated into an article of clothing or covering for an electronic device. Moreover, an article or fabric described herein can be disposed on or contacted with the skin of a human user or the surface of an electronic device in a conformal or substantially conformal manner.

An article described herein, in some embodiments, comprises a thermally insulating support and thermoelectric modules formed of a structure passing around or through the thermally insulating support to provide faces of the thermoelectric modules on opposing sides of the thermally insulating support. The thermoelectric modules can have the structure of a thermoelectric apparatus described hereinabove in Section I. In some embodiments, the structure of thermoelectric modules is continuous and electrically conductive. Moreover, in some embodiments, the thermoelectric modules are electrically connected to the thermally insulating support, including through one or more electrical contacts disposed in or on the support. Further, an electrical contact can comprise an electrical diode.

In addition, a continuous structure of thermoelectric modules comprises p-type layers coupled to n-type layers forming pn junctions, wherein insulating layers are partially disposed between the p-type layers and the n-type layers. In some embodiments, p-type layers and n-type layers of a continuous structure described herein are in a stacked configuration. Further, p-type layers and n-type layers at the faces of the thermoelectric modules can be substantially parallel to the opposing sides of the thermally insulating support. Additionally, a segment of a thermoelectric module structure passing around or through an insulating support can substantially normal to at least one of the faces of the thermoelectric module.

Moreover, p-type layers of a continuous thermoelectric module structure can comprise carbon nanoparticles with the n-type layers comprising n-doped carbon nanoparticles. Carbon nanoparticles of a p-type layer can be p-doped. Nanoparticles of a p-type layer and/or nanoparticles of an n-type layer can also be disposed in polymeric matrices, including polymeric matrices comprising electrically poled polymer.

Electrically poled polymer of thermoelectric modules can comprise non-randomly oriented electric dipoles and/or electric dipole domains. Moreover, electrically poled polymer can also exhibit an electric dipole field oriented parallel or substantially parallel to an axis of current flow in the thermoelectric module as well as exhibiting piezoelectric/pyroelectric behavior. The piezoelectric and/or pyroelectric properties of electrically poled polymeric compositions can permit articles incorporating such compositions to provide electrical output resulting from mechanical deformations in addition to the electrical output resulting from exposure to thermal gradients.

Additionally, an insulating layer of a thermoelectric module structure can comprise electrically poled polymer or electrically poled particles demonstrating piezoelectric behavior, such as barium titanate ($BaTiO_3$) particles, bismuth telluride particles (BiTe), other inorganic particles or mixtures thereof.

Further, in some embodiments, p-type layers, n-type layers or insulating layers of a thermoelectric module structure described herein exhibit a pyroelectric field. The pyroelectric field can have any orientation not inconsistent with the objectives of the present invention. For example, a pyroelectric field can be oriented parallel or substantially parallel to an axis of current flow in the structure.

As described herein, bringing a p-type layer and n-type layer into contact creates a pn-junction. In some embodiments, an interfacial transition region is present at a pn junction formed by a p-type layer in contact with an n-type layer. The interfacial transition region, in some embodiments, comprises nanoparticles of the p-type layer and the n-type layer mixing. Mixing of nanoparticles of the p-type and n-type layers can provide a pn junction of heterogeneous structure.

Additionally, a metallic interlayer can be disposed between a p-type layer and an n-type layer of a pn junction. A metallic interlayer can be formed of any metal not inconsistent with the objectives of the present invention. For example, a metallic interlayer can be formed of a noble metal including gold, platinum, iridium, palladium, osmium, silver, rhodium or ruthenium or alloys thereof. A metallic interlayer may also be formed from aluminum, nickel, copper, other transition metals or transition metal alloys. Further, a metallic interlayer may be formed of an organic material demonstrating metallic properties such as graphite or graphene.

A metallic interlayer can serve as a pinning layer. A pinning layer, in some embodiments, pins the Fermi levels of the adjacent n-type layer and p-type layer. Moreover, a pinning layer described herein can be energetically matched to the n-type layer or the p-type layer.

Moreover, in some embodiments, pn junctions of thermoelectric modules can serve as rectifiers for voltage output(s) associated with piezoelectric and/or pyroelectric behavior of poled polymeric constructions of the modules.

Further, as described herein, a thermally insulating support of an article can be one or more fibers of a fabric. Thus, in another aspect, thermoelectric fabrics are provided. For example, a fabric comprises one or more thermally insulating fibers and thermoelectric modules formed of a structure passing around or through the thermally insulating fibers to provide faces of the thermoelectric modules on opposing sides of the thermally insulating fibers. The thermoelectric modules can have any of the structures or properties described herein. Moreover, in some embodiments, the thermoelectric modules have a size selected to provide a desired stiffness or flexibility to the fabric, thereby permitting flexible or conformal contact between the fabric and a surface, such as a surface of a human body or a surface of an electronic device.

In addition, a fabric can comprise any thermally insulating fibers not inconsistent with the objectives of the present invention. For example, in some embodiments, a thermally insulating fiber comprises a thermally insulating plant fiber, animal fiber, or synthetic fiber. In some embodiments, a thermally insulating fiber comprises one or more of wool, silk, cotton, flax, jute, hemp, modal, lyocell, cellulose, polyester, polyolefin, polyurethane, polyamide, aramid, acrylic, nylon, spandex, and combinations thereof. Other thermally insulating fibers may also be used.

Additionally, a thermoelectric fabric described herein can have any textile or fabric structure or configuration not inconsistent with the objectives of the present invention. In some embodiments, for instance, a fabric described herein has a woven or weave configuration. In such embodiments, the thermally insulating fibers of the fabric can form the warp or the weft of the fabric. For example, the thermally insulating fibers can be disposed in the weft direction of the fabric and the structure of thermoelectric modules can be passed through or around the thermally insulating fibers in the warp direction. Further, in some embodiments, a fabric described herein can comprise a plurality of thermoelectric module structures arranged in one or more columns or rows and passing through or around plurality of thermally insulating fibers, the fibers also being arranged in one or more columns or rows. The columns or rows of thermally insulating fibers can be normal to the columns or rows of thermoelectric module structures.

Moreover, such columns or rows need not be contiguous, but instead can be non-contiguous, such that the fabric comprises open areas and closed areas. The open areas can permit the exchange of moisture and/or air between opposing sides of the thermally insulating fibers and/or between opposing sides of the fabric. The closed areas can prevent or inhibit such exchange of moisture and/or air between opposing sides of a fabric or fibers of a fabric. A fabric described herein can have any combination of open and closed areas not inconsistent with the objectives of the present invention. For example, in some embodiments, a fabric described herein comprises between about 10 percent and about 50 percent open area and between about 50 percent and about 90 percent closed area. Other configurations are also possible.

Opposing sides of the thermoelectric fabric or opposing sides of the thermally insulating support can form a "hot" side and a "cold" side of the fabric or article. The hot side of a fabric or article, for reference purposes herein, can comprise the side having a higher temperature, and the cold side can comprise the side having a lower temperature. For example, the hot side of a fabric or article is the side disposed against a hot or warm surface, such as the skin of a wearer or the surface of an electronic device such as a mobile phone with the cold side exposed to the external environment. In other cases, the side exposed to the external environment is the hot side of the fabric or article.

Moreover, faces of the thermoelectric modules of an article or fabric described herein can be disposed on the opposing sides of the fabric or article in any manner not inconsistent with the objectives of the present invention. In some embodiments, for instance, faces of the thermoelectric module structures are all disposed in the same manner, such that the positive (or negative) outputs of the thermal modules are all on the hot side or all on the cold side. Alternatively, in other embodiments, faces of the thermoelectric module structures can be disposed in different manners, such that some of the positive (or negative) outputs of the thermoelectric modules are on the hot side while other positive (or negative) outputs of the thermoelectric modules are on the cold side. Such a configuration, in some embodiments, can permit an article or fabric described herein to provide electrical energy regardless of which side of the fabric or article is the cold side or the hot side at any given time.

In general, electrical energy provided by the thermoelectric modules can be removed to an external circuit through one or more electrical contacts. The electrical contacts can be disposed on a surface or within the interior of a thermally insulating support described herein. For example, in some embodiments, one or more metal wires are disposed on the surface and/or within the interior of a thermally insulating support. Any metal wire not inconsistent with the objectives of the present invention may be used. In some embodiments, for instance, a metal wire comprises copper.

Further, an article or fabric described herein can also comprise one or more electrical buses or other external contacts for removing charge from the thermoelectric modules. For example, one row or column of thermoelectric modules may be configured to generate electrical energy in a cold-hot environment (wherein the external environment is relatively cold) while another row or column of thermoelectric modules may be configured to generate electrical energy in a hot-cold environment (wherein the external environment is relatively hot). In some such embodiments, the separate rows or columns can be electrically connected differently and/or separately or independently. Alternatively, in other embodiments, all of the thermoelectric modules of a fabric or article can be electrically connected in parallel, such as when all of the thermoelectric modules have the same orientation with respect to the hot and cold sides of the article or fabric.

Further, an article or fabric described herein can comprise an electrical connection to an electronic device and/or an energy storage medium, such as a mobile phone or battery, respectively. Thus, an article or fabric described herein can be used to directly power or charge an electronic device or battery.

Some embodiments will now be further described with reference to the figures. FIG. 8 illustrates a plan view of a thermoelectric article according to one embodiment described herein. FIG. 9 illustrates a cross-sectional view of the article of FIG. 8 taken along lines 9-9.

The thermoelectric article or fabric (100) illustrated in FIGS. 8 and 9 comprises a thermally insulating support (110) and thermoelectric modules (120) formed of a structure passing around or through the thermally insulating support (110) to provide faces (121, 122) of the thermoelectric modules (120) on opposing sides (111, 112) of the thermally insulating support (110). In some embodiments, the thermally insulating support (110) is one or more fibers of a fabric. In such embodiments, the thermally insulating support (110) can be disposed in the weft direction ($d_1$ in FIG. 8) and the thermoelectric modules (120) can be disposed in the warp direction ($d_2$ in FIG. 8). Moreover, such an arrangement can provide a fabric (100) having open areas (150) and closed areas.

As illustrated in FIGS. 1 and 2, the structures of thermoelectric modules (120) are continuous structures comprising two inflection points (123) where the structures have been curved or bent around or through the thermally insulating support (110). Moreover, p-type layers and n-type layers (not shown) at the faces (121, 122) of the thermoelectric modules (120) are substantially parallel to the opposing sides (111, 112) of the thermally insulating support (110). In addition, in the embodiment of FIGS. 8 and 9, a segment (124) of the structure of the thermoelectric modules (120) passing around or through the insulating support (110) is substantially normal to at least one of the faces (121, 122) of the thermoelectric modules (120).

Figure 10:
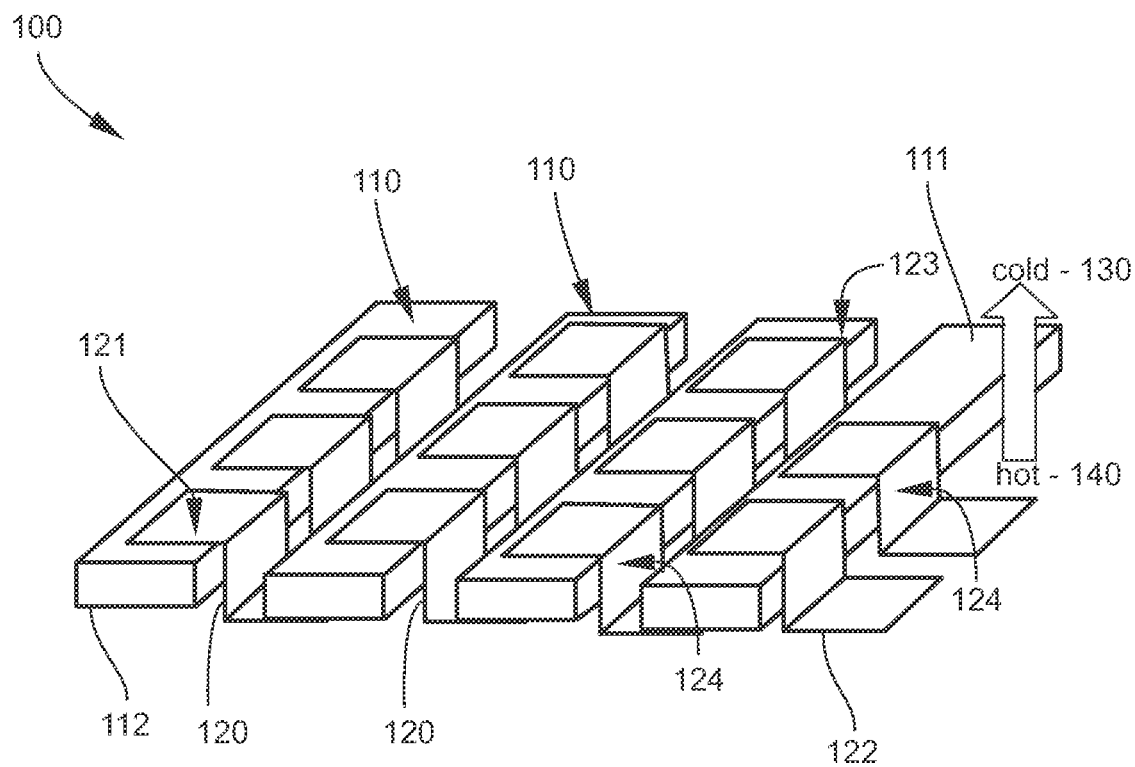
FIG. 10 illustrates a perspective view of an article according to one embodiment described herein.

FIG. 10 illustrates a perspective view of an article or fabric (100) according to one embodiment described herein. As illustrated in FIG. 10, the article or fabric (100) can have a cold side (130) and a hot side (140). The cold side (130) in the embodiment of FIG. 10 corresponds to faces (121) of the thermoelectric module structures (120) and the hot side (140) corresponds to faces (122) of the thermoelectric module structures (120) on the opposing side (112) of the thermally conductive support (110). However, as described hereinabove, other arrangements are also possible.

FIG. 1 illustrates an expanded side view of a thermoelectric module or a thermoelectric apparatus according to one embodiment described herein. The thermoelectric module illustrated in FIG. 1 comprises two p-type layers (1) coupled to an n-type layer (2) in an alternating fashion. The alternating coupling of p-type (1) and n-type (2) layers provides the thermoelectric modules a z-type configuration having pn junctions (4) on opposite sides of the module. Insulating layers (3) are disposed between interfaces of the p-type layers (1) and the n-type layer (2) as the p-type (1) and n-type (2) layers are in a stacked configuration. As described herein, the thermoelectric module provided in FIG. 1 is in an expanded state to facilitate illustration and understanding of the various components of the module. In some embodiments, however, the thermoelectric module is not in an expanded state such that the insulating layers (3) are in contact with a p-type layer (1) and an n-type layer (2). A thermoelectric module can comprise any desired number of p-type layers coupled to n-type layers in an alternating fashion.

FIG. 1 additionally illustrates the current flow through the thermoelectric module induced by exposing one side of the module to a heat source. Electrical contacts (X) are provided to the thermoelectric module for application of the thermally generated current to an external load.

FIG. 2 illustrates a thermoelectric module (200) according to one embodiment described herein wherein the p-type layers (201) and the n-type layers (202) are in a stacked configuration. The p-type layers (201) and the n-type layers (202) are separated by insulating layers (207) in the stacked configuration. The thermoelectric module (200) is connected to an external load by electrical contacts (204, 205).

Turning now to components that can be included in the various embodiments of a thermoelectric article or fabric described herein, an article or fabric described herein comprises a thermally insulting support or thermally insulating fibers. Any thermally insulating support or fibers not inconsistent with the objectives of the present invention may be used. In some embodiments, for instance, a thermally insulating support comprises natural or synthetic fibers, including one or more of wool, silk, cotton, flax, jute, hemp, modal, lyocell, cellulose, polyester, polyurethane, polyamide, aramid, acrylic, nylon, spandex, and combinations thereof. In some embodiments, a thermally insulating support comprises an inorganic material. An inorganic material can comprise an oxide such as a metal oxide or glass such as fiberglass. In some embodiments, an inorganic material comprises a ceramic material. Inorganic materials can comprise one or more of silica, titania, zirconia, and zinc oxide.

Moreover, a thermally insulating support of an article described herein can have any structure not inconsistent with the objectives of the present invention. For example, in some embodiments, a thermally insulating support has a net or mesh structure. Other structures can also be used, including non-woven structures.

An article or fabric described herein also comprises a thermoelectric module structure. Any structure of thermoelectric modules not inconsistent with the objectives of the present invention may be used. In some embodiments, for instance, a thermoelectric module of an article or fabric described herein comprises p-type layers coupled to n-type layers providing pn junctions and insulating layers disposed between the p-type and n-type layers. In some embodiments, p-type layers and n-type layers of a thermoelectric module comprise carbon nanoparticles.

Carbon nanoparticles of a p-type layer, in some embodiments, comprise fullerenes, carbon nanotubes, or mixtures thereof. Fullerenes, in some embodiments, comprise 1-(3-methoxycarbonyl)propyl-1-phenyl(6,6)$C_{61}$ (PCBM). In some embodiments, carbon nanotubes comprise single-walled carbon nanotubes (SWNT), multi-walled carbon nanotubes (MWNT), as well as p-doped single-walled carbon nanotubes, p-doped multi-walled carbon nanotubes or mixtures thereof.

In some embodiments, p-doped single-walled carbon nanotubes and/or p-doped multi-walled carbon nanotubes comprise boron in an amount ranging from about 0.1 weight percent to about 30 weight percent. In some embodiments, p-doped single-walled carbon nanotubes and/or p-doped multi-walled carbon nanotubes comprise boron in an amount ranging from about 5 weight percent to about 25 weight percent or from about 10 weight percent to about 20 weight percent. Further, p-doped single-walled carbon nanotubes and/or p-doped multi-walled carbon nanotubes can comprise oxygen.

A p-type dopant can be incorporated in the lattice of single-walled and/or multi-walled carbon nanotubes. In some embodiments, a p-type dopant is externally provided to carbon nanotubes by the environment surrounding the single walled and/or multi-walled carbon nanotubes. As described further herein, carbon nanotubes of a p-type layer can be disposed in a polymeric matrix. In some embodiments, the polymeric matrix can provide p-dopant to surfaces of the carbon nanotubes. In some embodiments wherein the polymeric matrix provides p-dopant to surfaces of the carbon nanotubes, the carbon nanotubes are not p-doped prior to incorporation into the polymeric matrix. Alternatively, the carbon nanotubes comprise p-dopant prior to incorporation into the polymeric matrix. Moreover, in some embodiments, chemical species also disposed in the polymeric matrix, such as alkali metals, can serve as p-dopant for the carbon nanotubes.

In some embodiments, carbon nanoparticles of a p-type layer have a high aspect ratio. The term aspect ratio, as used herein, refers to a carbon nanoparticle's length divided by the carbon nanoparticle's diameter or width. In some embodiments, carbon nanoparticles of a p-type layer demonstrate an aspect ratio ranging from about 1 to about $10^6$ or from about 10 to about 100,000.

Carbon nanoparticles of a p-type layer, including carbon nanotubes, in some embodiments, have a length ranging from about 1 nm to about 5 mm or from about 10 nm to about 1 mm. In some embodiments, carbon nanoparticles have a length ranging from about 50 nm to about 500 µm. Further, carbon nanoparticles of a p-type layer can have a diameter ranging from about 1 nm to about 100 nm.

In some embodiments, carbon nanoparticles of a p-type layer, including carbon nanotubes, are provided in a mat configuration or non-woven configuration.

A p-type layer, in some embodiments, comprises one or more species of carbon nanoparticles described herein in an amount ranging from about 0.1 weight percent to about 100 weight percent. In some embodiments, a p-type layer comprises carbon nanoparticles in an amount of at least about 2 weight percent or at least about 10 weight percent. In some embodiments, a p-type layer comprises carbon nanoparticles in an amount ranging from about 2 weight percent to about 50 weight percent or from about 5 weight percent to about 15 weight percent.

Carbon nanoparticle loadings of p-type layers can be chosen with reference to the desired Seebeck coefficient of the layer. For example, in some embodiments, SWNT loadings ranging from 5 weight percent to 100 weight percent provide a range of Seebeck coefficients for the p-type layers. FIG. 3, for example, illustrates Seebeck coefficient as a function of SWNT loading of a polyvinylidene fluoride (PVDF) matrix of p-type layers according to some embodiments described herein. As illustrated in FIG. 3, SWNT loadings ranging from 5 weight percent to 100 weight percent provide a range of Seebeck coefficients for the p-type layers. Nanoparticle loadings of a p-type layer, in some embodiments, can also be determined with reference to a desired percolation threshold.

Matrices of p-type layers can also be formed by combination of the carbon nanoparticles with a polymeric host. Any polymeric host material not inconsistent with the objectives of the present invention can be used in the production of a polymeric matrix for a p-type layer. In some embodiments, a polymeric matrix comprises semicrystalline polymer including, but not limited to, polyvinyl fluoride (PVF), polyvinylidene fluoride-trifluoroethylene (PVDF-TrFE), polyvinylidene fluoride-tetrafluoroethylene (PVDF-TFE), polytetrafluoroethylene (PTFE), or mixtures or copolymers thereof. Semicrystalline polymers of PVDF, PVDF-TFE and/or PVDF-TrFE used in p-type layers of the thermoelectric module can demonstrate increased amounts of β-phase. For example, PVDF, PVDF-TFE and/or PVDF-TrFE of a p-type layer can display a phase ratio of β/α of 1.5 to 2.5. In some embodiments, the β/α phase ratio is 2 to 2.5. As discussed herein, β-phase crystallites can be provided a non-random orientation by poling techniques, thereby enhancing piezoelectric and pyroelectric properties of the polymeric matrix for harvesting electrical energy resulting from mechanical fluctuations or stresses experienced by the fabric or article.

In some embodiments, a polymer matrix of a p-type layer comprises polyacrylic acid (PAA), polymethacrylate (PMA), polymethylmethacrylate (PMMA) or mixtures or copolymers thereof. A polymer matrix can also comprise a polyolefin including, but not limited to polyethylene, polypropylene, polybutylene or mixtures or copolymers thereof.

In some embodiments, a polymeric matrix of a p-type layer comprises one or more conjugated polymers, including thiophenes such as poly(3-hexylthiophene) (P3HT), poly(3-octylthiophene) (P3OT), and polythiophene (PTh).

In some embodiments, a polymeric matrix of a p-type layer comprises one or more semiconducting polymers. Semiconducting polymers can include phenylene vinylenes, such as poly(phenylene vinylene) and poly(p-phenylene vinylene) (PPV), and derivatives thereof. In some embodiments, semiconducting polymers comprise poly fluorenes, naphthalenes, and derivatives thereof. In some embodiments, semiconducting polymers comprise poly(2-vinylpyridine) (P2VP), polyamides, poly(N-vinylcarbazole) (PVCZ), polypyrrole (PPy), and polyaniline (PAn). In some embodiments, a semiconducting polymer comprises poly[2,6-(4,4-bis-(2-ethylhexyl)-4H-cyclopenta[2,1-b;3,4-b]dithiophene)-alt-4,7-(2,1,3-benzothiadiazole)] (PCPDTBT).

A p-type layer can have any desired thickness not inconsistent with the objectives of the present invention. A p-type layer can have a thickness of at least about 10 nm or at least about 100 nm. A p-type layer, in some embodiments, has a thickness of at least about 500 nm or at least about 1 µm. In some embodiments, a p-type layer has a thickness ranging from about 5 nm to about 50 µm.

In some embodiments, a p-type layer can have any desired length not inconsistent with the objectives of the present invention. In some embodiments, a p-type layer has a length of at least about 1 µm or at least about 10 µm. In some embodiments, a p-type layer has a length ranging from about 1 µm to about 100 mm.

A p-type layer, in some embodiments, has a Seebeck coefficient of at least about 5 µV/K or at least about 10 µV/K at a temperature of 290 K. In some embodiments, a p-type layer has a Seebeck coefficient of at least about 15 µV/K or at least about 30 µV/K at a temperature of 290 K. A p-type layer, in some embodiments, has a Seebeck coefficient ranging from about 5 µV/K to about 35 µV/K at a temperature of 290 K.

As described herein, the Seebeck coefficient of a p-type layer can be varied according to carbon nanoparticle identity and loading. For example, the Seebeck coefficient of a p-type layer can be inversely proportional to the single-walled carbon nanotube loading of the p-type layer.

In addition to at least one p-type layer, a thermoelectric module described herein comprises at least one n-type layer comprising a plurality of n-doped carbon nanoparticles. N-doped carbon nanoparticles, in some embodiments, comprise fullerenes, carbon nanotubes, or mixtures thereof. Fullerenes, in some embodiments, comprise 1-(3-methoxycarbonyl)propyl-1-phenyl(6,6)$C_{61}$ (PCBM). In some embodiments, n-doped carbon nanotubes comprise single-walled carbon nanotubes, multi-walled carbon nanotubes or mixtures thereof.

In some embodiments, carbon nanoparticles of a n-type layer, including carbon nanotubes, are provided in a mat configuration or non-woven format.

N-doped single-walled carbon nanotubes and/or n-doped multi-walled carbon nanotubes can comprise nitrogen in an amount ranging from about 0.1 weight percent to about 30 weight percent. In some embodiments, n-doped single-walled carbon nanotubes and/or n-doped multi-walled carbon nanotubes are deoxygenated nanotubes.

An n-type dopant can be incorporated in the lattice of single-walled and/or multi-walled carbon nanotubes. In some embodiments, an n-type dopant is externally provided to carbon nanotubes by the environment surrounding the single walled and/or multi-walled carbon nanotubes. Carbon nanotubes of an n-type layer can be disposed in a polymeric matrix, wherein the polymeric matrix can provide n-dopant to surfaces of the carbon nanotubes. In some embodiments, the carbon nanotubes are not n-doped prior to incorporation into the matrix. In other embodiments, the carbon nanotubes are n-doped prior to incorporation into the matrix.

In some embodiments, n-doped carbon nanoparticles of an n-type layer have a high aspect ratio. In some embodiments, n-doped carbon nanoparticles of an n-type layer demonstrate an aspect ratio ranging from about 1 to about $10^6$. In some embodiments, n-doped carbon nanoparticles display an aspect ratio ranging from about 10 to about 100,000.

Carbon nanoparticles of an n-type layer, including carbon nanotubes, in some embodiments, have a length ranging from about 1 nm to about 5 mm or from about 10 nm to about 1 mm. In some embodiments, n-doped carbon nanoparticles have a length ranging from about 50 nm to about 500 µm. Further, carbon nanoparticles of an n-type layer, in some embodiments, have a diameter ranging from about 1 nm to about 100 nm.

A n-type layer can comprise one or more species of n-doped carbon nanoparticles described herein in an amount ranging from about 0.1 weight percent to about 100 weight percent. In some embodiments, an n-type layer comprises n-doped carbon nanoparticles in an amount of at least about 2 weight percent or at least about 5 weight percent. In some embodiments, an n-type layer comprises n-doped carbon nanoparticles in an amount of at least about 10 weight percent. In some embodiments, an n-type layer comprises n-doped carbon nanoparticles in an amount ranging from about 2 weight percent to about 50 weight percent or from about 5 weight percent to about 15 weight percent. As with the p-type layer, nanoparticle loadings of an n-type layer can be determined with reference to the desired Seebeck coefficient of the layer. Nanoparticle loadings of an n-type layer can also be determined with reference to a desired percolation threshold.

As described herein, an n-type layer can further comprise a polymeric matrix in which the n-doped carbon nanoparticles are disposed. A polymeric matrix of an n-type layer can comprise any polymeric species recited herein for a p-type layer. For example, a polymeric matrix of an n-type layer can comprise semicrystalline polymer including, but not limited to, polyvinyl fluoride (PVF), polyvinylidene fluoride (PVDF), polyvinylidene fluoride-trifluoroethylene (PVDF-TrFE), polyvinylidene fluoride-tetrafluoroethylene (PVDF-TFE), polytetrafluoroethylene (PTFE) or mixtures or copolymers thereof. Semicrystalline polymers of PVDF, PVDF-TFE and/or PVDF-TrFE used in n-type layers of the thermoelectric module can demonstrate increased amounts of β-phase. For example, PVDF, PVDF-TFE and/or PVDF-TrFE of a n-type layer can display a ratio of β/α of 1.5 to 2.5. In some embodiments, the β/a ratio is 2 to 2.5. As discussed herein, β-phase crystallites can be provided a non-random orientation by poling techniques, thereby enhancing piezoelectric and pyroelectric properties of the matrix for harvesting electrical energy resulting from mechanical fluctuations or stresses experienced by the fabric or article.

An n-type layer can have any desired thickness not inconsistent with the objectives of the present invention. In some embodiments, an n-type layer has a thickness of at least about 1 nm. In some embodiments, an n-type layer has a thickness of at least about 10 nm or at least about 100 nm. In some embodiments, an n-type layer has a thickness ranging from about 5 nm to about 50 µm.

An n-type layer can have any desired length not inconsistent with the objectives of the present invention. In some embodiments, an n-type layer has a length of at least about 1 µm or at least about 10 µm. In some embodiments, an n-type layer has a length of at least about 100 µm or at least about 500 µm. In some embodiments, an n-type layer has a length ranging from about 1 µm to about 100 mm. In some embodiments, an n-type layer has a length coextensive or substantially coextensive with an adjacent p-type layer.

An n-type layer can also have a Seebeck coefficient of at least about −5 µV/K or at least about −10 µV/K at a temperature of 290 K. In some embodiments, an n-type layer has a Seebeck coefficient of at least about −15 µV/K or at least about −20 µV/K at a temperature of 290 K. In some embodiments, an n-type layer has a Seebeck coefficient of at least about −30 µV/K at a temperature of 290 K. An n-type layer, in some embodiments, has a Seebeck coefficient ranging from about −5 µV/K to about −35 µV/K at a temperature of 290 K.

The Seebeck coefficient of an n-type layer can be varied according to n-doped carbon nanoparticle identity and loading. For example, the Seebeck coefficient of an n-type layer can be inversely proportional to the carbon nanoparticle loading of the n-type layer.

In some embodiments of a thermoelectric module described herein, carbon nanoparticles including p-doped and n-doped carbon nanotubes can be substituted with one or more inorganic nanoparticles. In some embodiments, inorganic nanoparticles comprise group IV semiconductor materials, group II/VI semiconductor materials or group III/V semiconductor materials or combinations thereof. In some embodiments, inorganic semiconductor nanoparticles comprise quantum dots and/or nanowires. Intrinsic inorganic semiconductor materials can be provided with p-dopant or n-dopant for use in respective p-layers and n-layers described herein.

A thermoelectric module described herein also comprises insulating layers disposed between the p-type layers and the n-type layers. In some embodiments, an insulating layer is electrically insulating. In some embodiments, the insulating layer is electrically insulating and thermally insulating. In some embodiments, a thermoelectric module comprises a plurality of insulating layers disposed between a plurality of p-type layers and n-type layers. Insulating layers can permit p-type layers and n-type layers of a thermoelectric modules described herein to be arranged in a stacked configuration.

In some embodiments, an insulating layer comprises one or more polymeric materials. Any polymeric material not inconsistent with the objectives of the present invention can be used in the production of an insulating layer. A polymeric insulating layer can comprise semicrystalline polymer including, but not limited to, polyvinyl fluoride (PVF), polyvinylidene fluoride (PVDF), polyvinylidene fluoride-trifluoroethylene (PVDF-TrFE), polyvinylidene fluoride-tetrafluoroethylene (PVDF-TFE), polytetrafluoroethylene (PTFE), or mixtures or copolymers thereof. Semicrystalline polymers of PVDF, PVDF-TFE and/or PVDF-TrFE used in insulating layers of the thermoelectric module can demonstrate increased amounts of β-phase. For example, PVDF, PVDF-TFE and/or PVDF-TrFE of an insulating layer can display a ratio of β/α of 1.5 to 2.5. In some embodiments, the β/α ratio is 2 to 2.5. As discussed herein, β-phase crystallites can be provided a non-random orientation by poling techniques, thereby enhancing piezoelectric and pyroelectric properties of the insulating layer.

An insulating layer, in some embodiments, comprises polyacrylic acid (PAA), polymethacrylate (PMA), polymethylmethacrylate (PMMA) or mixtures or copolymers thereof In some embodiments, an insulating layer comprises a polyolefin including, but not limited to polyethylene, polypropylene, polybutylene or mixtures or copolymers thereof.

A polymeric insulating layer can also comprise particles demonstrating piezoelectric behavior. For example, a polymeric insulating layer can comprise particles of $BaTiO_3$, BiTe particles, other inorganic piezoelectric particles or mixtures thereof. The $BaTiO_3$ particles, BiTe particles and/or other inorganic particles can have any size and/or geometry not inconsistent with the objectives of the present invention. $BaTiO_3$ and BiTe particles can demonstrate a size distribution ranging from 20 nm to 500 nm. Further, piezoelectric particles can be dispersed in polymer of the insulation layer at any loading not inconsistent with the objectives of the present invention. In some embodiments, $BaTiO_3$ particles, BiTe particles and/or other inorganic piezoelectric particles are nanoparticles are present in an insulating layer in an amount of 5-80 weight percent or 10-50 weight percent. As described herein, piezoelectric particles of an insulating layer can be electrically poled to further enhance the piezoelectric and/or pyroelectric properties of thermoelectric modules described herein.

Alternatively, in some embodiments, an insulating layer can be formed of an inorganic or ceramic material. In some embodiments, an insulating layer is formed of metal oxide particles, including transition metal oxide particles. Suitable metal oxide particles can also demonstrate piezoelectric behavior. In one embodiment, for example, an insulating layer is formed of $BaTiO_3$ particles that can be electrically poled.

An insulating layer can have any desired thickness not inconsistent with the objectives of the present invention. In some embodiments, an insulating layer has a thickness of at least about 50 nm. In some embodiments, an insulating layer has a thickness of at least about 75 nm or at least about 100 nm. In some embodiments, an insulating layer has a thickness ranging from about 5 nm to about 50 µm.

An insulating layer can have any desired length not inconsistent with the objectives of the present invention. In some embodiments, an insulating layer has a length substantially consistent with the lengths of the p-type and n-type layers between which the insulating layer is disposed. In some embodiments, an insulating layer has a length of at least about 1 µm or at least about 10 µm. In some embodiments, an insulating layer has a length of at least about 100 µm or at least about 500 µm. An insulating layer can have a length ranging from about 1 µm to about 100 µm.

A thermoelectric module described herein, in some embodiments, comprises a plurality of p-type layers and a plurality of n-type layers. A thermoelectric module can comprise any number of p-type layers and n-type layers not inconsistent with the objectives of the present invention. In some embodiments, the p-type layers and the n-type layers are ordered in alternating fashion and in a stacked configuration, being separated by insulating layers. In some embodiments, a thermoelectric module comprises at least 3 p-type layers and at least 3 n-type layers. In some embodiments, a thermoelectric module comprises at least 5 p-type layers and at least 5 n-type layers. In some embodiments, a thermoelectric module comprises at least 10 p-type layers and at least 10 n-type layers. In some embodiments, a thermoelectric module comprises at least 15 p-type layers and at least 15 n-type layers. In some embodiments, a thermoelectric module comprises at least 100 p-type layers and at least 100 n-type layers. In some embodiments, a thermoelectric module comprises at least 1000 p-type layers and at least 1000 n-type layers.

A thermoelectric module described herein comprising one or more p-type layers and one or more n-type layers can have the form of a fabric. The fabric is flexible permitting application of the thermoelectric module to a variety of substrates or supports having different surface shapes and/or morphologies. In some embodiments, for example, a thermoelectric module is applied to curved and/or other non-planar substrates. Additionally, the flexible fabric nature of the thermoelectric module permits bending of the module as illustrated in FIGS. 8-10 herein.

A thermoelectric module having a construction described herein can have a Seebeck coefficient of at least about 25 µV/K at a temperature of 290 K. In some embodiments, a thermoelectric module described herein has a Seebeck coefficient of at least about 30 µV/K or at least about 50 µV/K at a temperature of 290 K. In some embodiments, a thermoelectric module described herein has a Seebeck coefficient of at least about 75 µV/K or at least about 100 µV/K at a temperature of 290 K. A thermoelectric module described herein, in some embodiments, has a Seebeck coefficient of at least about 150 µV/K or at least about 175 µV/K at a temperature of 290 K. In some embodiments, a thermoelectric module described herein has a Seebeck coefficient of at least about 200 µV/K at a temperature of 290 K. In some embodiments, a thermoelectric module described herein has a Seebeck coefficient ranging from about 25 µV/K to about 250 µV/K at a temperature of 290 K. In some embodiments, a thermoelectric module described herein has a Seebeck coefficient ranging from about 50 µV/K to about 150 µV/K at a temperature of 290 K.

A thermoelectric module described herein can have a ZT of at least 0.5. A thermoelectric module described herein, in some embodiments, has a ZT of at least about 0.7 or at least about 0.8. In some embodiments, a thermoelectric module described herein has a ZT of at least about 1 or at least about 1.5. In some embodiments, a thermoelectric module described herein has a ZT ranging from about 0.5 to about 2.5, from about 0.5 to about 2 or from about 0.8 to about 1.5. In some embodiments, a thermoelectric module described herein has a ZT ranging from about 1 to about 1.3. In some embodiments, a thermoelectric module described herein has a ZT ranging from about 1 to 10.

VII. Methods of Making a Thermoelectric Article

In another aspect, methods of making an article are described herein. Methods of making articles described herein can be used to make any article or fabric described hereinabove in Section VI.

In some embodiments, a method of making an article comprises providing a thermally insulating support and passing a structure of thermoelectric modules around or through the thermally insulating support to provide faces of the thermoelectric modules on opposing sides of the thermally insulating support. The thermally insulating support and thermoelectric module structure can comprise any thermally insulating support and thermoelectric module structure described hereinabove in Section VI. In some embodiments, for example, the structure of thermoelectric modules is continuous. Further, a continuous structure can comprise p-type layers coupled to n-type layers forming pn junctions, wherein insulating layers are partially disposed between the p-type layers and the n-type layers. In addition, in some embodiments, p-type layers and n-type layers at the faces of the thermoelectric modules are substantially parallel to the opposing sides of the thermally insulating support. Moreover, the thermally insulating support can be one or more fibers of a fabric.

Further, in some embodiments of a method described herein, passing the structure of thermoelectric modules around or through the thermally insulating support further comprises providing a segment of the structure substantially normal to at least one of the faces of the thermoelectric modules.

Additionally, in some embodiments, a method described herein further comprises providing one or more electrical connections and electrically connecting the thermoelectric modules to the electrical connection(s). An electrical connection can include any electrical connection described hereinabove in Section VI. For example, in some embodiments, a method described herein further comprises electrically connecting the thermoelectric modules in parallel, including through one or more electrical contacts of a thermally insulating support.

The various steps of methods described herein can be carried out in any manner not inconsistent with the objectives of the present invention. In some embodiments, for instance, a step of a method is carried out using one or more of 3D printing, piezo-printing, spray-printing, and extrusion printing. Such a printing method, for example, can be used to provide one or more electrical connections if desired.

VIII. Methods of Producing Electrical Energy

In another aspect, methods of producing electrical energy are described herein. In some embodiments, a method of producing electrical energy comprises providing an article comprising a thermally insulating support and thermoelectric modules formed of a structure passing around or through the thermally insulating support to provide faces of the thermoelectric modules on opposing sides of the thermally insulating support. Thermal energy is absorbed by the thermoelectric modules to induce a voltage across the thermoelectric modules. Additionally, thermoelectric modules of the article, in some embodiments, demonstrate piezoelectric/pyroelectric properties permitting generation of electrical energy in response to mechanical fluctuations or stresses on the article. Any article described hereinabove in Section VI may be used in a method described herein.

These and other embodiments are further illustrated by the following non-limiting example.

Example 1

Thermoelectric Apparatus

A first p-type layer was fabricated by providing 35 mg of single-walled carbon nanotubes (SWNT) to which was added 17.5 ml of dimethylacrylamide (DMA). The resulting mixture was high energy sonicated for a period of one hour. Polyvinylidene fluoride (PVDF) was added to the mixture in an amount to render the SWNT 20 weight percent of the mixture on a total solids basis. The resulting SWNT/PVDF/DMA mixture was high energy sonicated for one hour.

A glass slide having dimensions of 75 mm×45 mm was cleaned in methanol and placed on a hot plate at 90° C. The SWNT/PVDF/DMA mixture was poured evenly onto the slide and the DMA was allowed to evaporate. The dried SWNT/PVDF film was placed into an oven at 100° C. for 12 hours to anneal. The slide was subsequently removed from the oven and methanol was poured over the SWNT/PVDF film. The SWNT/PVDF film was carefully removed from the glass slide, washed in deionized water and dried.

A second p-type layer was prepared according to the foregoing procedure. Moreover, an n-type layer was prepared according to the foregoing procedure, the difference being n-doped carbon nanotubes were combined with the DMA and PVDF.

Two insulating layers were prepared according to the following procedure. 600 mg of polypropylene (PP) were added to DMA in a ratio of 0.025 ml DMA to 1 mg of polypropylene powder. The resulting mixture was sonicated until the PP powder was dissolved in the DMA. A glass slide having dimensions of 75 mm×45 mm was cleaned in methanol and placed on a hot plate at 90° C. The PP/DMA mixture was poured evenly onto the slide, and the DMA was allowed to evaporate. Methanol was poured over the resulting PP film, and the PP film was carefully removed from the glass slide.

Figure 5:
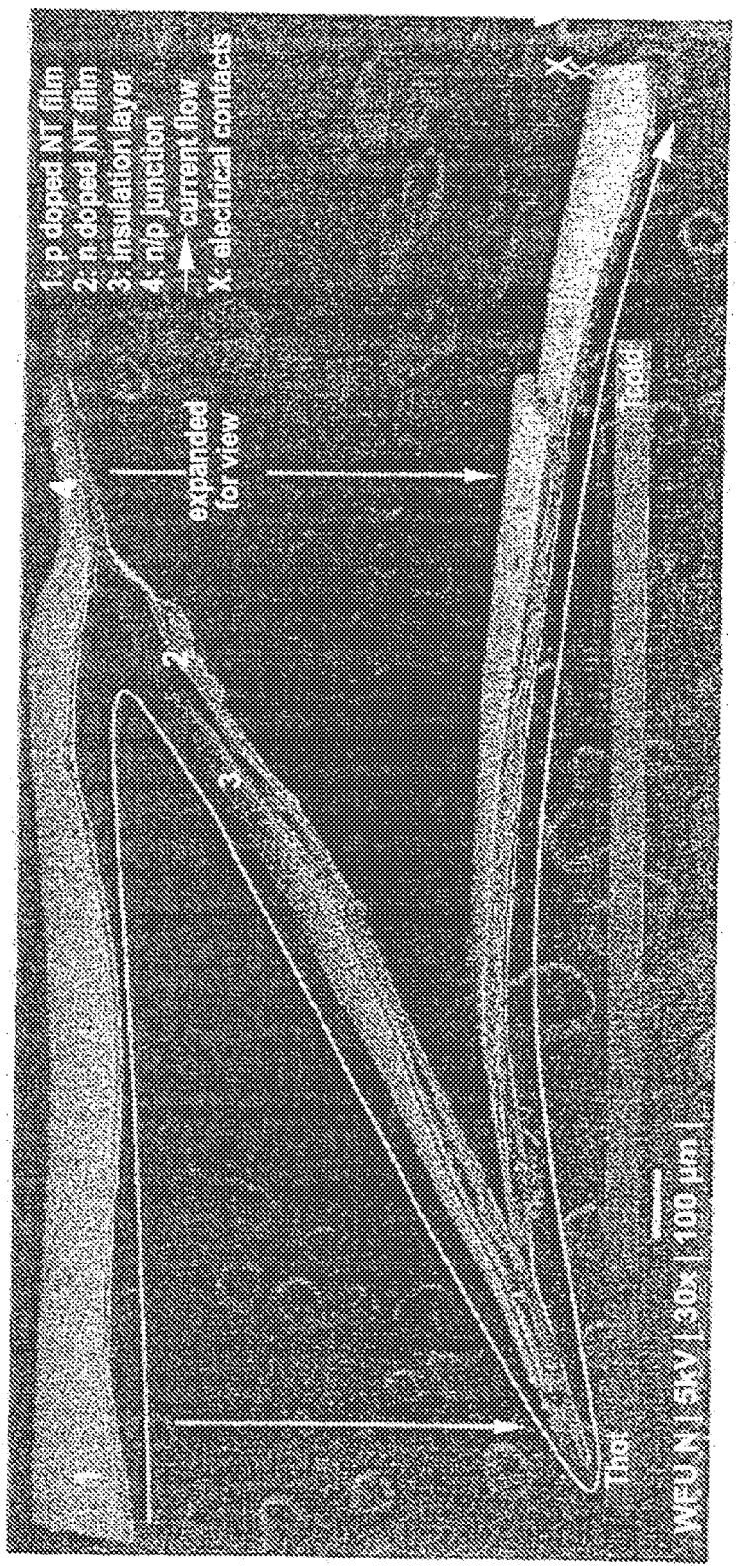
FIG. 5 illustrates a side expanded view of a thermoelectric apparatus according to one embodiment described herein.

The two p-type layers, n-type layer and the two insulating layers were subsequently coupled to provide the thermoelectric apparatus as illustrated in FIG. 5. The resulting thermoelectric apparatus was expanded in FIG. 5 for illustration of the various components of the apparatus.

Various embodiments of the invention have been described in fulfillment of the various objectives of the invention. It should be recognized that these embodiments are merely illustrative of the principles of the present invention. Numerous modifications and adaptations thereof will be readily apparent to those skilled in the art without departing from the spirit and scope of the invention.

That which is claimed is:

1. A thermoelectric apparatus comprising:
at least one p-type layer coupled to at least one n-type layer to provide a pn junction; and
an insulating layer at least partially disposed between the p-type layer and the n-type layer, the p-type layer comprising carbon nanoparticles disposed in a first polymeric matrix and the n-type layer comprising n-doped carbon nanoparticles disposed in a second polymeric matrix, wherein at least one of the first polymeric matrix, the second polymeric matrix, and the insulating layer comprises electrically poled polymer exhibiting an electric dipole field oriented parallel or substantially parallel to an axis of current flow in the apparatus, and the pn junction functions as a rectifier for asymmetric voltage outputs of the p-type layer and the n-type layer.

2. The thermoelectric apparatus of claim 1, wherein the electrically poled polymer comprises a plurality of non-randomly oriented electric dipoles or electric dipole domains.

3. The thermoelectric apparatus of claim 1, wherein the electrically poled polymer exhibits piezoelectric properties, pyroelectric properties or combinations thereof.

4. The thermoelectric apparatus of claim 1, wherein the insulating layer comprises electrically poled piezoelectric particles.

5. The thermoelectric apparatus of claim 4, wherein the piezoelectric particles comprise inorganic particles.

6. The thermoelectric apparatus of claim 5, wherein the inorganic particles comprise barium titanate, bismuth telluride or mixtures thereof.

7. The thermoelectric apparatus of claim 4, wherein the piezoelectric particles are dispersed in a polymeric matrix.

8. The thermoelectric apparatus of claim 7, wherein the polymeric matrix is not electrically poled.

9. The thermoelectric apparatus of claim 1, wherein the p-type layer, the n-type layer or both exhibit a pyroelectric field.

10. The thermoelectric apparatus of claim 9, wherein the pyroelectric field is oriented parallel or substantially parallel to an axis of current flow in the apparatus.

11. The thermoelectric apparatus of claim 1, wherein the electrically poled polymer comprises semicrystalline polymer.

12. The thermoelectric apparatus of claim 1, wherein the electrically poled polymer comprises a fluoropolymer.

13. The thermoelectric apparatus of claim 12, wherein the fluoropolymer comprises polyvinyl fluoride, polyvinylidene fluoride, polyvinylidene fluoride-trifluoroethylene, polyvinylidene fluoride-tetrafluoroethylene or mixtures thereof.

14. The thermoelectric apparatus of claim 13, wherein the fluoropolymer demonstrates $\beta/\alpha$ phase ratio of 1.5-2.5.

15. The thermoelectric apparatus of claim 1, wherein the carbon nanoparticles of the p-type layer are present in the first polymeric matrix in an amount of 5-95 weight percent, and then-doped carbon nanoparticles of then-type layer are present in the second polymeric matrix in an amount of 5-95 weight percent.

16. The thermoelectric apparatus of claim 1 further comprising a plurality of p-type layers coupled to a plurality of n-type layers providing a plurality of pn junctions and insulating layers at least partially disposed between the plurality of p-type layers and the plurality of n-type layers, wherein the pn junctions serve as rectifiers for voltage outputs of the p-type layers and the n-type layers.

17. The thermoelectric apparatus of claim 1, wherein the carbon nanoparticles of the p-type layer comprise single-walled carbon nanotubes, multi-walled carbon nanotubes, fullerenes or mixtures thereof.

18. The thermoelectric apparatus of claim 17, wherein the carbon nanoparticles of the p-type layer comprise boron.

19. The thermoelectric apparatus of claim 18, wherein the boron is present in the carbon nanoparticles in an amount ranging from about 0.1 weight percent to about 30 weight percent.

20. The thermoelectric apparatus of claim 1, wherein the n-doped carbon nanoparticles of then-type layer comprise single-walled carbon nanotubes, multi-walled carbon nanotubes, fullerenes or mixtures thereof.

21. The thermoelectric apparatus of claim 20, wherein the n-doped carbon nanoparticles comprise nitrogen.

22. The thermoelectric apparatus of claim 21, wherein the nitrogen is present in the carbon nanoparticles in an amount ranging from about 0.1 weight percent to about 30 weight percent.

23. The thermoelectric apparatus of claim 1, wherein the insulating layer comprises an electrically insulating polymeric material.

24. The thermoelectric apparatus of claim 23, wherein the electrically insulating polymeric material is selected from the group consisting of polyolefin, polyvinyl fluoride (PVF), polyvinylidene fluoride (PVDF), polyvinylidene fluoride-trifluoroethylene (PVDF-TrFE), polyvinylidene fluoride-tetrafluoroethylene (PVDF-TFE), polytetrafluoroethylene (PTFE), or mixtures or copolymers thereof.

25. The thermoelectric apparatus of claim 1, wherein the carbon nanoparticles of the p-type layer are substituted with p-doped inorganic nanoparticles and the n-doped carbon nanoparticles of the n-type layer are substituted with n-doped inorganic nanoparticles.

26. The thermoelectric apparatus of claim 14 having a ZT of at least 0.5.

27. The thermoelectric apparatus of claim 1, wherein the voltage outputs of the p-type layer and the n-type layer are asymmetric.

28. The thermoelectric apparatus of claim 1, wherein the insulating layer has a thickness of at least 50 nm.

* * * * *